(12) United States Patent
Satake et al.

(10) Patent No.: US 10,513,655 B2
(45) Date of Patent: Dec. 24, 2019

(54) WAVELENGTH CONVERSION MEMBER, BACKLIGHT UNIT INCLUDING WAVELENGTH CONVERSION MEMBER, LIQUID CRYSTAL DISPLAY DEVICE, AND METHOD OF MANUFACTURING WAVELENGTH CONVERSION MEMBER

(71) Applicant: FUJIFILM Corporation, Tokyo (JP)

(72) Inventors: Ryo Satake, Kanagawa (JP); Makoto Kamo, Kanagawa (JP); Naoyoshi Yamada, Kanagawa (JP); Tatsuya Oba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 230 days.

(21) Appl. No.: 15/660,333

(22) Filed: Jul. 26, 2017

(65) Prior Publication Data

US 2017/0321116 A1 Nov. 9, 2017

Related U.S. Application Data

(63) Continuation of application No. PCT/JP2016/000500, filed on Feb. 1, 2016.

(30) Foreign Application Priority Data

Feb. 2, 2015 (JP) .................. 2015-018861

(51) Int. Cl.
*C09K 11/02* (2006.01)
*C09K 11/08* (2006.01)
(Continued)

(52) U.S. Cl.
CPC ............... *C09K 11/02* (2013.01); *F21V 9/30* (2018.02); *G02B 5/12* (2013.01); *G02B 5/20* (2013.01);
(Continued)

(58) Field of Classification Search
CPC ...... F21V 9/30–38; C09J 11/06; C08G 59/24; C08G 29/3218; C08G 59/4085
(Continued)

(56) References Cited

U.S. PATENT DOCUMENTS

2004/0122208 A1\* 6/2004 Okada .................. C08G 59/681
528/408
2010/0075150 A1\* 3/2010 Takahashi ............. C23C 16/345
428/411.1
(Continued)

FOREIGN PATENT DOCUMENTS

CN 103228983 A 7/2013
CN 103476873 A 12/2013
(Continued)

OTHER PUBLICATIONS

Office Action, issued by the State Intellectual Property Office dated Feb. 28, 2019, in connection with Chinese Patent Application No. 201680007989.6.
(Continued)

*Primary Examiner* — Ramsey Zacharia
(74) *Attorney, Agent, or Firm* — Edwards Neils LLC; Jean C. Edwards, Esq.

(57) ABSTRACT

Provided is a wavelength conversion member including: a wavelength conversion layer including at least one kind of quantum dots that are excited by excitation light to emit fluorescence and are dispersed in an organic matrix; and a barrier layer that is provided adjacent to at least one main surface of the wavelength conversion layer and includes silicon nitride and/or silicon oxynitride as a major component, in which the organic matrix is obtained by curing a curable composition including at least an alicyclic epoxy compound and includes a chemical structure A which is
(Continued)

bonded to silicon nitride and/or silicon oxynitride as a major component of the barrier layer.

12 Claims, 6 Drawing Sheets

(51) Int. Cl.

| | | |
|---|---|---|
| F21V 9/30 | (2018.01) | |
| G02B 1/14 | (2015.01) | |
| G02B 5/20 | (2006.01) | |
| G02B 5/12 | (2006.01) | |
| H01L 33/50 | (2010.01) | |
| G02B 6/00 | (2006.01) | |
| G02F 1/1335 | (2006.01) | |
| F21V 8/00 | (2006.01) | |

(52) U.S. Cl.
CPC .......... *H01L 33/501* (2013.01); *C09K 11/08* (2013.01); *G02B 6/005* (2013.01); *G02F 2001/133614* (2013.01); *G02F 2201/50* (2013.01); *G02F 2202/02* (2013.01); *G02F 2202/36* (2013.01)

(58) Field of Classification Search
USPC ............... 428/413, 414, 415, 416, 417, 698
See application file for complete search history.

(56) References Cited

U.S. PATENT DOCUMENTS

2012/0113672 A1  5/2012  Dubrow et al.
2014/0030642 A1  1/2014  Takasaki et al.

FOREIGN PATENT DOCUMENTS

JP     2013-544018 A    12/2013
WO     2012/064562 A1    5/2012

OTHER PUBLICATIONS

International Search Report issued in connection with International Patent Application No. PCT/JP2016/000500 dated May 31, 2016.
Written Opinion issued in connection with International Patent Application No. PCT/JP2016/000500 dated May 31, 2016.
International Preliminary Report on Patentability issued in connection with International Patent Application No. PCT/JP2016/000500 dated Aug. 8, 2017.

* cited by examiner

WAVELENGTH CONVERSION MEMBER, BACKLIGHT UNIT INCLUDING WAVELENGTH CONVERSION MEMBER, LIQUID CRYSTAL DISPLAY DEVICE, AND METHOD OF MANUFACTURING WAVELENGTH CONVERSION MEMBER

CROSS-REFERENCE TO RELATED APPLICATIONS

This application is a continuation application of International Application No. PCT/JP2016/000500, filed Feb. 1, 2016, which was published under PCT Article 21(2) in Japanese, the disclosure of which is incorporated herein by reference in its entirety. Further, this application claims priority from Japanese Patent Application No. 2015-018861, filed Feb. 2, 2015, the disclosure of which is incorporated herein by reference in its entirety.

BACKGROUND OF THE INVENTION

1. Field of the Invention

The present invention relates to a wavelength conversion member, a backlight unit including the wavelength conversion member, and a liquid crystal display device, the wavelength conversion member including a wavelength conversion layer including quantum dots which emit fluorescence when irradiated with excitation light. The present invention also relates to a method of manufacturing a wavelength conversion member including a wavelength conversion layer including quantum dots which emit fluorescence when irradiated with excitation light.

2. Description of the Related Art

A flat panel display such as a liquid crystal display device (hereinafter, also referred to as "LCD") has been more widely used as a space-saving image display device having low power consumption. A liquid crystal display device includes at least a backlight and a liquid crystal cell and typically further includes a member such as a backlight-side polarizing plate or a visible-side polarizing plate.

Recently, a configuration in which a wavelength conversion layer including quantum dots (QDs) as a light emitting material is provided in a wavelength conversion member of a backlight unit in order to improve color reproducibility of an LCD has attracted attention (refer to US2012/0113672A and JP2013-544018A). The wavelength conversion member converts the wavelength of light incident from a surface light source so as to emit white light. In the wavelength conversion layer including the quantum dots as a light emitting material, white light can be realized using fluorescence which is emitted by excitation of two or three kinds of quantum dots having different light emitting properties caused by light incident from a surface light source.

The fluorescence emitted from the quantum dots has high brightness and a small full width at half maximum. Therefore, an LCD using quantum dots has excellent color reproducibility. Due to the progress of such a three-wavelength light source technique using quantum dots, the color reproduction range has widened from 72% to 100% in terms of the current TV standard (FHD, National Television System Committee (NTSC)) ratio.

An LCD including a wavelength conversion member in which quantum dots are used has the above-described excellent color reproducibility but, in a case where the quantum dots are photooxidized due to contact with oxygen, has a problem in that the emission intensity decreases (the light fastness is low). Accordingly, in order to realize an LCD with high brightness durability, that is, with high long-term reliability, it is important to suppress contact between quantum dots and oxygen.

As described in US2012/0113672A and JP2013-544018A, in a general aspect of a wavelength conversion layer including quantum dots as a light emitting material, the quantum dots are substantially dispersed uniformly in an organic matrix (polymer matrix). Therefore, in order to suppress contact between quantum dots and oxygen in a wavelength conversion member, it is important to reduce the oxygen content in a wavelength conversion layer and to suppress contact between quantum dots and oxygen in a wavelength conversion layer.

From the viewpoint of reducing the oxygen content in a wavelength conversion layer, US2012/0113672A describes a configuration in which a barrier substrate (barrier film) which suppresses permeation of oxygen is laminated on a layer including quantum dots in order to protect the quantum dots from oxygen and the like.

Regarding such a barrier film, for example, the following aspects are known: an aspect in which a barrier layer which is formed of an organic layer or an inorganic layer having barrier properties is laminated on a surface of a film-shaped substrate; and an aspect in which a substrate itself is formed of a material having excellent barrier properties without providing the barrier layer thereon. As the inorganic layer having barrier properties, an inorganic layer formed of an inorganic oxide, an inorganic nitride, an inorganic oxynitride, a metal, or the like is preferably used.

From the viewpoint of suppressing contact between quantum dots and oxygen in a wavelength conversion layer, a configuration of using a material having low oxygen permeability as a material of an organic matrix of the wavelength conversion layer can be considered. JP2013-544018A describes an aspect in which a matrix material includes epoxy as an aspect in which quantum dots are protected in domains of a hydrophobic material having impermeability to moisture and oxygen.

SUMMARY OF THE INVENTION

By using the above-described wavelength conversion layer including an organic matrix having low oxygen permeability in combination with the above-described barrier substrate, photooxidation of quantum dots in the wavelength conversion layer can be effectively suppressed. However, in a case where defects caused by lamination, for example, formation of pores between the organic matrix of the wavelength conversion layer and the barrier substrate, occur in the wavelength conversion member, the respective performances of the organic matrix and the substrate may be insufficient.

The present invention has been made in consideration of the above-described circumstances, and an object thereof is to provide: a wavelength conversion member which has excellent light fastness and can exhibit high brightness durability when incorporated into a liquid crystal display device; and a backlight unit including the same wavelength conversion member.

Another object of the present invention is to provide a liquid crystal display device having excellent light fastness and high long-term reliability of brightness.

Still another object of the present invention is to provide a method of manufacturing a wavelength conversion member which has excellent light fastness and can exhibit high brightness durability when incorporated into a liquid crystal display device.

The present inventors found that a polymer which is obtained by curing a curable composition including an alicyclic epoxy compound is preferable as a matrix material of a wavelength conversion layer having low oxygen permeability. In addition, as a barrier layer which has low oxygen permeability and suppresses a photooxidation reaction of quantum dots, an inorganic layer including silicon nitride or silicon oxynitride as a major component is preferable.

However, it was found that adhesiveness between a polymer, which is obtained by curing a curable composition including an alicyclic epoxy compound, and an inorganic layer including silicon nitride or silicon oxynitride as a major component may be insufficient.

Therefore, the present inventors performed a thorough investigation on a configuration in which a wavelength conversion layer including quantum dots, which are dispersed in an organic matrix obtained by curing a curable composition including an alicyclic epoxy compound, and a barrier layer including silicon nitride and/or silicon oxynitride as a major component can be laminated with high adhesiveness, thereby completing the present invention.

That is, according to the present invention, there is provided a wavelength conversion member comprising:

a wavelength conversion layer including at least one kind of quantum dots that are excited by excitation light to emit fluorescence and are dispersed in an organic matrix; and a barrier layer that is provided adjacent to at least one main surface of the wavelength conversion layer and includes silicon nitride and/or silicon oxynitride as a major component, in which the organic matrix is obtained by curing a curable composition including at least an alicyclic epoxy compound and includes a chemical structure A which is bonded to silicon nitride and/or silicon oxynitride as a major component of the barrier layer.

In this specification, "barrier layer including silicon nitride and/or silicon oxynitride as a major component" refers to a barrier layer including 90 mass % or higher of silicon nitride, silicon oxynitride, or a mixture of silicon nitride and silicon oxynitride.

In addition, in this specification, "adjacent to" represents "in direct contact with".

It is preferable that the barrier layer includes silicon nitride as a major component.

It is preferable that the chemical structure A is a structure which forms a covalent bond with silicon nitride and/or silicon oxynitride as a major component of the barrier layer or a structure which forms a hydrogen bond with silicon nitride and/or silicon oxynitride as a major component of the barrier layer.

As the chemical structure A which forms a covalent bond with silicon nitride and/or silicon oxynitride as a major component of the barrier layer, a structure which forms a siloxane bond with silicon nitride and/or silicon oxynitride as a major component of the barrier layer is preferable.

As the chemical structure A which forms a hydrogen bond with silicon nitride and/or silicon oxynitride as a major component of the barrier layer, a structure which forms a hydrogen bond with silicon nitride and/or silicon oxynitride as a major component of the barrier layer based on at least one of an amino group, a mercapto group, or a urethane structure is preferable.

In the wavelength conversion member according to the present invention, it is preferable that the chemical structure A is bonded to the organic matrix through a chemical structure B.

It is preferable that the chemical structure B is a structure which forms a covalent bond or a hydrogen bond with the organic matrix.

As the chemical structure B which forms a covalent bond with the organic matrix, a structure which forms a covalent bond with the organic matrix based on at least one of an amino group, a mercapto group, or an epoxy group is preferable.

As the chemical structure B which forms a hydrogen bond with the organic matrix, a structure which forms a hydrogen bond with the organic matrix based on at least one of an amino group, a carboxyl group, or a hydroxy group is preferable.

As the alicyclic epoxy compound which forms the organic matrix when cured, the following alicyclic epoxy compound I can be preferably used.

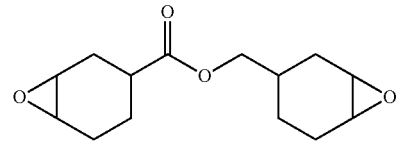

Alicyclic Epoxy Compound I

In the wavelength conversion member according to the present invention, it is preferable that the wavelength conversion layer is formed by curing a quantum dot-containing curable composition including the quantum dots, the alicyclic epoxy compound, and a compound which is bonded to silicon nitride and/or silicon oxynitride as a major component of the barrier layer to form the chemical structure A. It is more preferable that the compound which forms the chemical structure A further forms the chemical structure B with the organic matrix.

According to the present invention, there is provided a backlight unit comprising:

a surface light source that emits primary light;

the wavelength conversion member according to the present invention that is provided on the surface light source;

a retroreflecting member that is disposed to face the surface light source with the wavelength conversion member interposed therebetween; and a reflection plate that is disposed to face the wavelength conversion member with the surface light source interposed therebetween, in which the wavelength conversion member is excited by excitation light, which is at least a portion of the primary light emitted from the surface light source, to emit the fluorescence and emits at least light which includes secondary light including the fluorescence.

According to the present invention, there is provided a liquid crystal display device comprising:

the backlight unit according to the present invention; and a liquid crystal cell unit that is disposed to face the retroreflecting member side of the backlight unit.

According to the present invention, there is provided a method of manufacturing a wavelength conversion member, the wavelength conversion member including
a wavelength conversion layer including at least one kind of quantum dots that are excited by excitation light to emit fluorescence and are dispersed in an organic matrix,
a barrier layer that is provided adjacent to at least one main surface of the wavelength conversion layer and includes silicon nitride and/or silicon oxynitride as a major component, and
the method sequentially comprising:
a step of preparing a barrier film that includes the barrier layer on a substrate;
a step of forming a coating film of a quantum dot-containing curable composition by applying the quantum dot-containing curable composition to a surface of the barrier layer, the quantum dot-containing curable composition including the quantum dots, an alicyclic epoxy compound, and a compound which is bondable to silicon nitride and/or silicon oxynitride as a major component of the barrier layer and/or a compound which is bondable to silicon nitride and/or silicon oxynitride as a major component of the barrier layer and is bondable to the organic matrix; and
a step of photocuring or thermally curing the coating film.

In this specification, "inorganic layer" is a layer including an inorganic material as a major component and is preferably a layer consisting only of an inorganic material. On the other hand, "organic layer" is a layer including an organic material as a major component in which the content of the organic material is preferably 50 mass % or higher, more preferably 80 mass % or higher, and still more preferably 90 mass % or higher.

In addition, in this specification. "full width at half maximum" of a peak refers to the width of the peak at ½ the height of the peak. In addition, light having a center emission wavelength in a wavelength range of 430 nm to 480 nm is called blue light, light having a center emission wavelength in a wavelength range of 500 nm or longer and shorter than 600 nm is called green light, and light having a center emission wavelength in a wavelength range of 600 nm to 680 nm is called red light.

In this specification, the moisture permeability of the barrier layer is a value measured under conditions of measurement temperature: 40° C., and relative humidity: 90% RH using a method (calcium method) described in G NISATO, P. C. P. BOUTEN, P. J. SLIKKERVEER et al., SID Conference Record of The International Display Research Conference, pages 1435-1438. In this specification, the unit of the moisture permeability is [g/(m$^2$·day·atm)]. A moisture permeability of 0.1 g/(m$^2$·day·atm) corresponds to 1.14×10$^{-11}$ g/(m$^2$·s·Pa) in SI units.

In this specification, the oxygen permeability is a value measured using an oxygen permeability measuring device (OX-TRAN 2/20 (trade name), manufactured by Mocon Inc.) under conditions of measurement temperature: 23° C., and relative humidity: 90%. In this specification, the unit of the oxygen permeability is [cm$^3$/(m$^2$·day·atm)]. An oxygen permeability of 1.0 cm$^3$/(m$^2$·day·atm) corresponds to 1.14× 10$^{-11}$ fm/(s·Pa) in SI units.

The wavelength conversion member according to the present invention includes: a wavelength conversion layer including at least one kind of quantum dots that are excited by excitation light to emit fluorescence and are dispersed in an organic matrix having high barrier properties; and a barrier layer having high barrier properties that is provided adjacent to at least one main surface of the wavelength conversion layer, in which the organic matrix of the wavelength conversion layer includes the chemical structure A which is bonded to silicon nitride and/or silicon oxynitride as the major component of the barrier layers. In the above-described configuration, permeation of oxygen into the wavelength conversion layer is effectively prevented, and a decrease in the emission intensity caused by photooxidation of the quantum dots in the wavelength conversion layer can be suppressed. Further, adhesiveness between the wavelength conversion layer and the barrier layer is high. Therefore, oxygen is not likely to permeate from a non-adhered portion between the wavelength conversion layer and the barrier layers. Accordingly, according to the present invention, it is possible to provide: a wavelength conversion member which has excellent light fastness and can exhibit high brightness durability when incorporated into a liquid crystal display device; and a backlight unit including the same wavelength conversion member.

DESCRIPTION OF THE PREFERRED EMBODIMENTS

Figure 1:
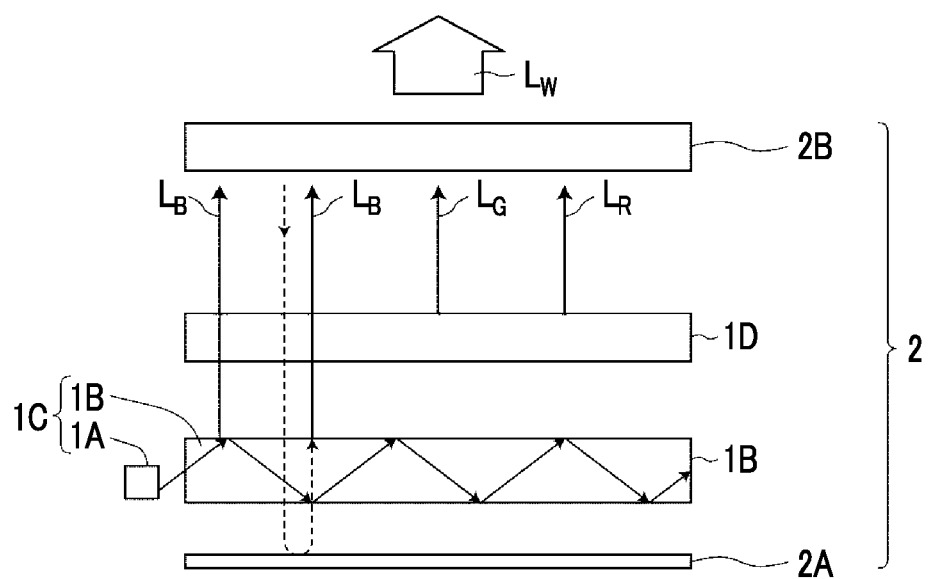
FIG. 1 is a cross-sectional view showing a schematic configuration of a backlight unit including a wavelength conversion member according to an embodiment of the present invention.
Figure 2:
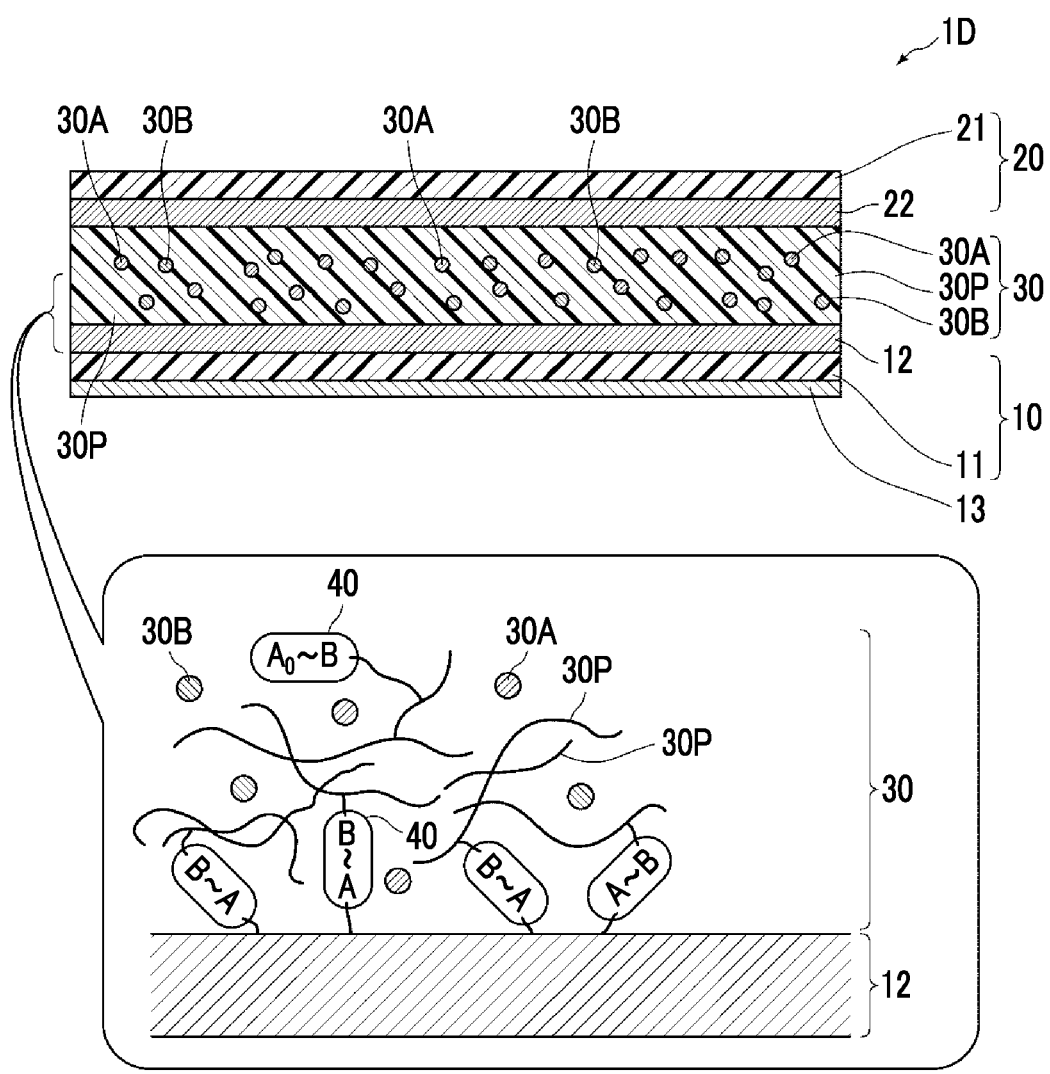
FIG. 2 shows a cross-sectional view showing a schematic configuration of a wavelength conversion member according to an embodiment of the present invention and a partially enlarged view showing the vicinity of a wavelength conversion layer-barrier layer interface (a schematic diagram showing a first aspect of a chemical structure A).

A wavelength conversion member according to an embodiment of the present invention and a backlight unit including the wavelength conversion member will be described with reference to the drawings. FIG. 1 is a cross-sectional view showing a schematic configuration of the backlight unit including the wavelength conversion member according to the embodiment. FIG. 2 shows a cross-sectional view showing a schematic configuration of the wavelength conversion member according the embodiment and a partially enlarged view showing the vicinity of a wavelength conversion layer-barrier layer interface (a schematic diagram showing a first aspect of a chemical structure A). In the drawings of this specification, dimensions of respective portions are appropriately changed in order to easily recognize the respective portions. In this specification, numerical ranges represented by "to" include numerical values before and after "to" as lower limit values and upper limit values.

As shown in FIG. 1, the backlight unit 2 includes: a surface light source 1C including a light source 1A, which emits primary light (blue light $L_B$), and a light guide plate 1B which guides and emits the primary light emitted from the light source 1A; a wavelength conversion member 1D that is provided on the surface light source 1C; a retroreflecting member 2B that is disposed to face the surface light source 1C with the wavelength conversion member 1D interposed therebetween; and a reflection plate 2A that is disposed to face the wavelength conversion member 1D with the surface light source 1C interposed therebetween. The wavelength conversion member 1D are excited by excitation light, which is at least a portion of the primary light $L_B$ emitted from the surface light source 1C, to emit fluorescence and emits secondary light ($L_G$, $L_R$) which includes the fluorescence and the primary light $L_B$ which has passed through the wavelength conversion member 1D.

The shape of the wavelength conversion member 1D is not particularly limited and may be an arbitrary shape such as a sheet shape or a bar shape.

In FIG. 1, $L_B$, $L_G$, and $L_R$ emitted from the wavelength conversion member 1D are incident on the retroreflecting member 2B, and each incident light is repeatedly reflected between the retroreflecting member 2B and the reflection plate 2A and passes through the wavelength conversion member 1D multiple times. As a result, in the wavelength conversion member 1D, a sufficient amount of the excitation light (blue light $L_B$) is absorbed by quantum dots 30A and 30B, a sufficient amount of fluorescence ($L_G$, $L_R$) is emitted, and white light $L_W$ is realized and emitted from the retroreflecting member 2B.

In a case where ultraviolet light is used as the excitation light, by causing ultraviolet light as excitation light to be incident on a wavelength conversion layer 30 including quantum dots 30A, 30B, and 30C (not shown), white light $L_W$ can be realized by red light emitted from the quantum dots 30A, green light emitted from the quantum dots 30B, and blue light emitted from the quantum dots 30C.

[Wavelength Conversion Member]

The wavelength conversion member 1D includes: the wavelength conversion layer 30 including the quantum dots 30A and 30B that are excited by excitation light ($L_B$) to emit fluorescence ($L_G$, $L_R$) and are dispersed in an organic matrix 30P; and barrier layers 12 and 22 each of which is provided adjacent to a main surface the wavelength conversion layer 30 and includes silicon nitride and/or silicon oxynitride, in which the organic matrix 30P is obtained by curing a curable composition including at least an alicyclic epoxy compound and includes a chemical structure A which is bonded to silicon nitride and/or silicon oxynitride as a major component of the barrier layers 12 and 22 (FIG. 2).

In the embodiment, barrier films 10 and 20 are provided on opposite main surfaces of the wavelength conversion layer 30, and the barrier films 10 and 20 include substrates 11 and 21 and barrier layers 12 and 22 supported on surfaces of the substrates 11 and 21, respectively.

In FIG. 2, in the wavelength conversion member 1D, the upper side (the barrier film 20 side) is the retroreflecting member 2B side in the backlight unit 2, and the lower side (the barrier film 10 side) is the surface light source 1C side in the backlight unit 2. Permeation of oxygen and water, which has permeated into the wavelength conversion member 1D, into the wavelength conversion layer 30 from the retroreflecting member 2B side and the surface light source 1C side is suppressed by the barrier films 10 and 20.

In the embodiment, the barrier layers 12 and 22 are formed on the substrates 11 and 21, respectively, but the present invention is not limited to this configuration. Each of the barrier films 10 and 20 may include a barrier layer that is not formed on a substrate.

In the wavelength conversion member 1D, the barrier film 10 includes an unevenness imparting layer (mat layer) 13 which imparts an uneven structure to a surface of the barrier film 10 opposite to the wavelength conversion layer 30 side. In the embodiment, the unevenness imparting layer 13 also functions as a light diffusion layer.

FIG. 2 shows a partially enlarged view showing the vicinity of an interface between the wavelength conversion layer 30 and the barrier layer 12 (a schematic diagram showing the first aspect of the chemical structure A). The partially enlarged view shows only the vicinity of the interface between the wavelength conversion layer 30 and the barrier layer 12, and an interface between the wavelength conversion layer 30 and the barrier layer 22 may have the same configuration.

As shown in the partially enlarged view of FIG. 2, the chemical structure A in the wavelength conversion layer 30 is included in an adherence agent 40. In this specification, the adherence agent 40 represents both a compound which is included in a quantum dot-containing curable composition as a raw material solution of the wavelength conversion layer 30 and a partial structure which forms the chemical structure A and/or a chemical structure B in the wavelength conversion layer 30.

In the first aspect shown in the partially enlarged view of FIG. 2, the adherence agent 40 is bonded to silicon nitride and/or silicon oxynitride as a major component of the barrier layer 12 to form the chemical structure A and is bonded to the organic matrix 30P to form the chemical structure B. In a second aspect shown in a second aspect of FIG. 3, the adherence agent 40 is bonded to silicon nitride and/or silicon oxynitride as a major component of the barrier layer 12 to form the chemical structure A and is included in the organic matrix 30P without being bonded to the organic matrix 30P.

In addition, the adherence agent 40 may be included in the wavelength conversion layer 30 without forming the chemical structure A or the chemical structure B. In the adherence agent 40, a structure which can form but has yet to form the chemical structure A is represented by $A_0$.

The chemical structure A is not particularly limited as long as it is a structure which is bonded to silicon nitride and/or silicon oxynitride as a major component of the barrier layer. Preferable examples of the chemical structure A include a structure which forms a covalent bond or a hydrogen bond with silicon nitride and/or silicon oxynitride.

As the chemical structure A which forms a covalent bond with silicon nitride and/or silicon oxynitride as a major component of the barrier layer, a structure which forms a siloxane bond with silicon nitride and/or silicon oxynitride as a major component of the barrier layer is preferable.

In addition, as the chemical structure A which forms a hydrogen bond with silicon nitride and/or silicon oxynitride as a major component of the barrier layer, a structure which forms a hydrogen bond with silicon nitride and/or silicon oxynitride as a major component of the barrier layer based on at least one of an amino group, a mercapto group, or a urethane structure is preferable.

The chemical structure B is not particularly limited as long as it is a structure which is bonded to the organic matrix 30P. It is preferable that the chemical structure B is a structure which forms a covalent bond or a hydrogen bond with the organic matrix 30P. It is more preferable that the chemical structure B is bonded to a chemical structure of an organic matrix derived from an alicyclic epoxy compound.

As the chemical structure B which forms a covalent bond with the organic matrix 30P, a structure which forms a covalent bond with the organic matrix 30P based on at least one of an amino group, a mercapto group, or an epoxy group is preferable.

As the chemical structure B which forms a hydrogen bond with the organic matrix 30P, a structure which forms a hydrogen bond with the organic matrix 30P based on at least one of an amino group, a carboxyl group, or a hydroxy group is preferable.

Specific examples of the adherence agent 40 (compound) which can form the chemical structure A and/or the chemical structure B will be described in detail in the description of a curable composition below.

As described in detail in the item of "Summary", as the configuration capable of suppressing the photooxidation of the quantum dots 30A and 30B in the wavelength conversion layer 30 of the wavelength conversion member, a configuration in which an organic matrix obtained by curing a curable composition including an alicyclic epoxy compound is used as the organic matrix 30P of the wavelength conversion layer 30 and in which an inorganic layer including silicon nitride or silicon oxynitride as a major component is used as the barrier layer was conceived. However, in the above-described configuration, in order to simultaneously realize light fastness and high front brightness when the wavelength conversion member is incorporated into a liquid crystal display device, it is necessary to improve adhesiveness between the wavelength conversion layer 30 and the barrier layers 12 and 22.

As described above, in the wavelength conversion member 1D, the wavelength conversion layer 30 includes the quantum dots 30A and 30B which are dispersed in the organic matrix 30P obtained by curing a curable composition including an alicyclic epoxy compound, and includes the chemical structure A which is bonded to silicon nitride and/or silicon oxynitride as a major component of the barrier layers 12 and 22. In the above-described configuration, permeation of oxygen into the wavelength conversion layer 30 is effectively prevented, and a decrease in the emission intensity caused by photooxidation of the quantum dots 30A and 30B in the wavelength conversion layer 30 can be suppressed. Further, adhesiveness between the wavelength conversion layer 30 and the barrier layers 12 and 22 is high. Therefore, oxygen is not likely to permeate from a nonadhered portion between the wavelength conversion layer and the barrier layers. Accordingly, the wavelength conversion member 1D and the backlight unit 2 including the same has excellent light fastness and can exhibit high brightness durability when incorporated into a liquid crystal display device.

Hereinafter, each component of the wavelength conversion member 1D will be described, and then a method of manufacturing the wavelength conversion member will be described.

[Wavelength Conversion Layer]

Figure 3:
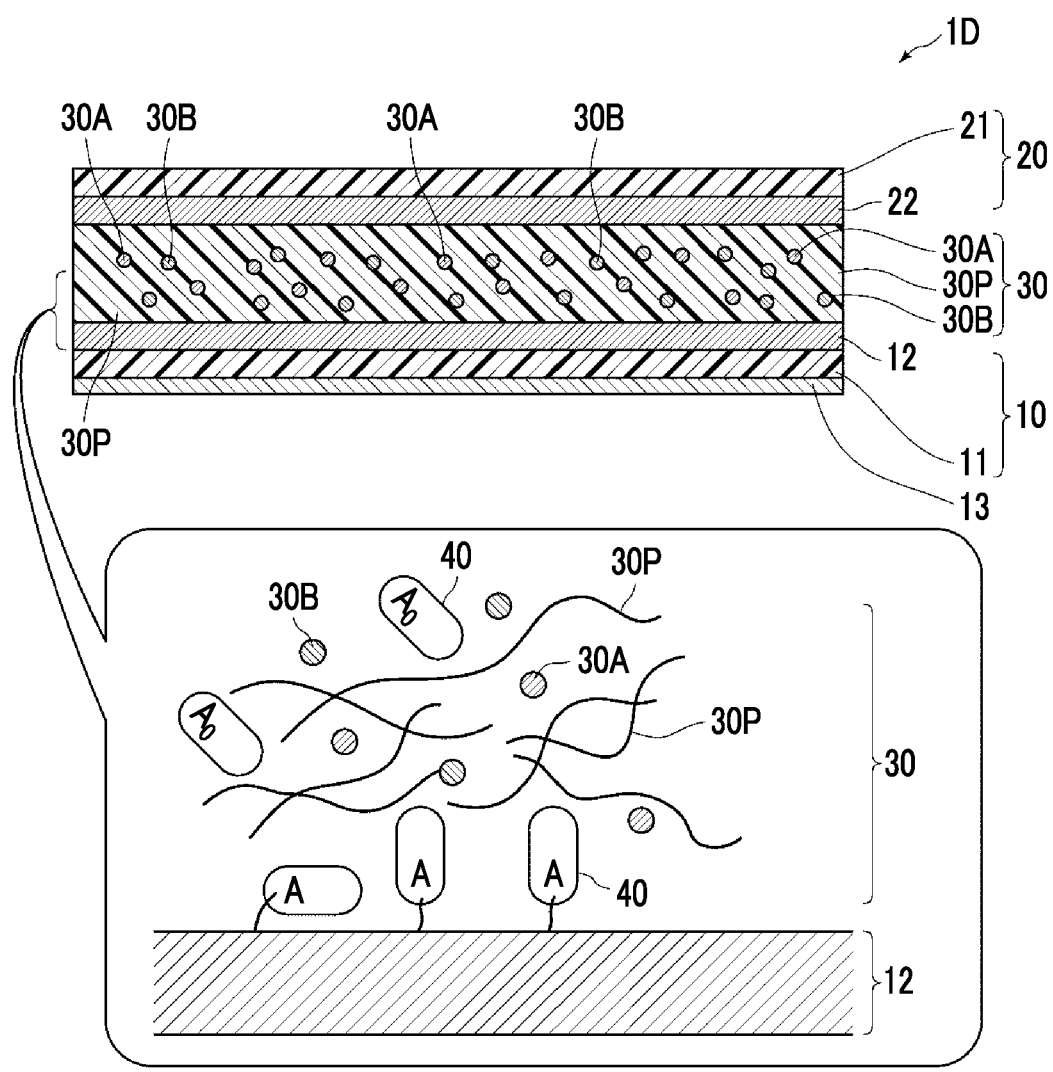
FIG. 3 is a schematic diagram showing a second aspect of the chemical structure A in the vicinity of the wavelength conversion layer-barrier layer interface of the wavelength conversion member shown in FIG. 2.

In the wavelength conversion layer 30, the quantum dots 30A and the quantum dots 30B are dispersed in an organic matrix 30P, in which the quantum dots 30A are excited by the blue light $L_B$ to emit the fluorescence (red light) $L_R$, and the quantum dots 30B are excited by the blue light $L_B$ to emit the fluorescence (green light) $L_G$. In FIGS. 2 and 3, the quantum dots 30A and 30B are enlarged and shown in order to easily recognize the quantum dots. Actually, for example, the thickness of the wavelength conversion layer 30 is 50 to 100 μm, and the diameter of the quantum dot is about 2 to 7 nm.

The thickness of the wavelength conversion layer 30 is preferably in a range of 1 to 500 μm, more preferably in a range of 10 to 250 μm, and still more preferably in a range of 30 to 150 μm. It is preferable that the thickness is 1 μm or more because a high wavelength conversion effect can be obtained. In addition, it is preferable that the thickness is 500 μm or less because, in a case where the wavelength conversion member is incorporated into a backlight unit, the thickness of the backlight unit can be reduced.

Alternatively, in the wavelength conversion layer 30, the quantum dots 30A, the quantum dots 30B, and the quantum dots 30C may be dispersed in the organic matrix 30P, in which the quantum dots 30A are excited by ultraviolet light $L_{UV}$ to emit the fluorescence (red light) $L_R$, the quantum dots 30B are excited by the ultraviolet light $L_{UV}$ to emit the fluorescence (green light) $L_G$, and the quantum dots 30C are excited by the ultraviolet light $L_{UV}$ to emit the fluorescence (blue light) $L_B$. The shape of the wavelength conversion layer is not particularly limited and may be an arbitrary shape.

The wavelength conversion layer 30 can be formed by curing a quantum dot-containing curable composition including the quantum dots 30A and 30B, the compound (adherence agent) 40 which is bonded to silicon nitride and/or silicon oxynitride as a major component of the barrier layer to form the chemical structure A, and a curable compound which forms the organic matrix 30P when cured (hereinafter, basically referred to as "quantum dot-containing curable composition). The curable compound which forms the organic matrix 30P when cured includes an alicyclic epoxy compound. That is, the wavelength conversion layer 30 is a cured layer obtained by curing the quantum dot-containing curable composition. In addition, the adherence agent 40 does not have an adverse effect on the curing reaction of the polymerizable composition including the quantum dots.

[Quantum Dot-Containing Curable Composition] The quantum dot-containing curable composition includes the quantum dots 30A and 30B, the adherence agent 40, and a curable compound including an alicyclic epoxy compound which forms the organic matrix 30P when cured. The quantum dot-containing curable composition further includes other components such as a polymerization initiator in addition to the above-described components.

A method of preparing the quantum dot-containing curable composition is not particularly limited and may be prepared according to a preparation procedure of a general polymerizable composition. It is preferable that the adherence agent 40 is added at a final stage of the preparation of the composition in order to reduce factors which impair bonding between the adherence agent 40 and silicon nitride and/or silicon oxynitride as a major component of the barrier layers 12 and 22.

<Quantum Dots>

The quantum dots may include two or more kinds of quantum dots having different light emitting properties. In the embodiment, the quantum dots include the quantum dots 30A which are excited by the blue light $L_B$ to emit the fluorescence (red light) $L_R$ and the quantum dots 30B which are excited by the blue light $L_B$ to emit the fluorescence (green light) $L_G$. In addition, the quantum dots may include the quantum dots 30A which are excited by the ultraviolet light $L_{UV}$ to emit the fluorescence (red light) $L_R$, the quantum dots 30B which are excited by the ultraviolet light $L_{UV}$ to emit the fluorescence (green light) $L_G$, and the quantum dots 30C which are excited by the ultraviolet light $L_{UV}$ to emit the fluorescence (blue light) $L_B$.

Examples of well-known kinds of quantum dots include the quantum dots 30A having a center emission wavelength in a wavelength range of 600 nm to 680 nm, the quantum dots 30B having a center emission wavelength in a wavelength range of 520 nm to 560 nm, and the quantum dots 30C (which emit blue light) having a center emission wavelength in a wavelength range of 400 nm to 500 nm.

In addition to the above description, the details of the quantum dots can be found in, for example, paragraphs "0060" to "0066" of JP2012-169271 A, but the present invention is not limited thereto. As the quantum dots, a commercially available product can be used without any particular limitation. From the viewpoint of improving durability, core-shell semiconductor nanoparticles are preferable. As a core, II-VI semiconductor nanoparticles, III-V semiconductor nanoparticles, and multi-component semiconductor nanoparticles can be used. Specific examples of the core include CdSe, CdTe, CdS, ZnS, ZnSe, ZnTe, InP, InAs, InGaP, and $CuInS_2$, but the present invention is not limited thereto. Among these, CdSe, CdTe, InP, InGaP, or $CuInS_2$ is preferable from the viewpoint of emitting visible light with high efficiency. As a shell, CdS, ZnS, ZnO, GaAs, and a complex thereof can be used, but the present invention is not limited thereto. The emission wavelength of the quantum dots can be typically adjusted by adjusting the composition of particles and the size of particles.

The quantum dots may be added to the polymerizable composition in the form of particles or in the form of a dispersion in which they are dispersed in a solvent. It is preferable that the quantum dots are added in the form of a dispersion from the viewpoint of suppressing aggregation of particles of the quantum dots. The solvent used herein is not particularly limited. For example, 0.01 parts by mass to 10 parts by mass of the quantum dots can be added to the quantum dot-containing curable composition with respect to 100 parts by mass of the total mass of the curable composition.

The content of the quantum dots in the quantum dot-containing curable composition is preferably 0.01 to 10 mass % and more preferably 0.05 to 5 mass % with respect to the total mass of the curable compound in the polymerizable composition.

<Curable Compound>

The curable compound which is included in the quantum dot-containing curable composition and forms the organic matrix 30P when cured is not particularly limited as long as it includes 30 mass % of an alicyclic epoxy compound. From the viewpoint of oxygen barrier properties, the content of the alicyclic epoxy compound in the curable compound is preferably 50 mass % or higher, more preferably 80 mass % or higher, and still more preferably 100 mass % (excluding impurities).

(Alicyclic Epoxy Compound)

The curable compound includes at least an alicyclic epoxy compound as a polymerizable compound. As the alicyclic epoxy compound, one kind may be used, or two or more kinds having different structures may be used. In the following description, in a case where two or more kinds having different structures are used as the alicyclic epoxy compound, the content of the alicyclic epoxy compound refers to the total content thereof. The same shall be applied to a case where two or more kinds having different structures are used as other components.

The alicyclic epoxy compound has higher curing properties by light irradiation than an aliphatic epoxy compound. It is preferable that a polymerizable compound having excellent photocuring properties is used from the viewpoints of improving productivity and forming a layer in which an irradiated portion and a non-irradiated portion have uniform properties. As a result, in the wavelength conversion member, the curling of the wavelength conversion layer can be suppressed, and the quality can be made to be uniform. In general, an epoxy compound is likely to have a reduced curing shrinkage during photocuring. This point is advantageous in forming a smooth wavelength conversion layer having a reduced deformation.

The alicyclic epoxy compound includes at least one alicyclic epoxy group. Here, the alicyclic epoxy group refers to a monovalent substituent having a condensed ring of an epoxy ring and a saturated hydrocarbon ring and preferably a monovalent substituent having a condensed ring of an epoxy ring and a cycloalkane ring. Preferable examples of the alicyclic epoxy compound include a compound having one or more structures shown below in one molecule, in which an epoxy ring and a cyclohexane ring are condensed.

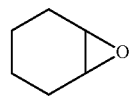

The number of the structures included in one molecule may be two or more and is preferably one or two.

In addition, the structure may include one or more substituents. Examples of the substituent include an alkyl group (for example, an alkyl group having 1 to 6 carbon atoms), a hydroxyl group, an alkoxy group (for example, an alkoxy group having 1 to 6 carbon atoms), and a halogen atom (for example, a fluorine atom, a chlorine atom, or a bromine atom), a cyano group, an amino group, a nitro group, an acyl group, and a carboxyl group. The structure may have the above-described substituent but is preferably unsubstituted.

In addition, the alicyclic epoxy compound may include a polymerizable functional group other than the alicyclic epoxy group. The polymerizable functional group refers to a functional group which can cause a polymerization reaction to occur by radical polymerization or cationic polymerization, and examples thereof include a (meth)acryloyl group.

Preferable examples of a commercially available product of the alicyclic epoxy compound include: CELLOXIDE 2000, CELLOXIDE 2021P, CELLOXIDE 3000, CELLOXIDE 8000, CYCLOMER M100, EPOLEAD GT 301, and EPOLEAD GT 401 (all of which are manufactured by Daicel Corporation); 4-vinylcyclohexene dioxide (manufactured by Sigma-Aldrich Co., LLC.); D-limonene oxide (manufactured by Nippon Terpene Chemicals, Inc.); and SANSOCIZER E-PS (manufactured by New Japan Chemical Co., Ltd.). Among these, one kind can be used alone, or two or more kinds can be used in combination.

From the viewpoint of improving adhesiveness between the wavelength conversion layer and a layer adjacent thereto, the following alicyclic epoxy compound I or II is more preferable. As a commercially available product of the alicyclic epoxy compound I, CELLOXIDE 2021P (manufactured by Daicel Corporation) can be used. As a commercially available product of the alicyclic epoxy compound II, CYCLOMER M100 (manufactured by Daicel Corporation) can be used.

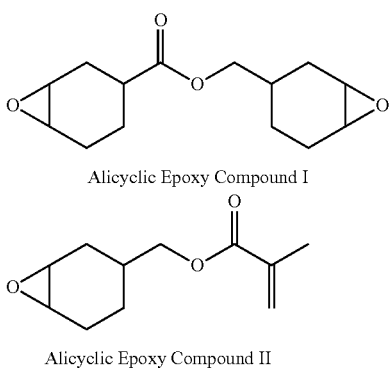

Alicyclic Epoxy Compound I

Alicyclic Epoxy Compound II

In addition, the alicyclic epoxy compound can also be synthesized using a well-known method. A method of preparing the alicyclic epoxy compound is not particularly limited. For example, the alicyclic epoxy compound can be synthesized with reference to "The Fourth Series of Experimental Chemistry, 20 Organic Synthesis II, pp. 213~(Maruzen-Yushodo Co., Ltd., 1992), "The Chemistry of Heterocyclic Compounds—Small Ring Heterocycles. Part 3 Oxiranes" (Ed. by Alfred Hasfner, John Wiley and Sons, An Interscience Publication, New York, 1985), "Adhesion, Vol. 29. No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), and JP2926262B.

((Curable Compound which can be Used in Combination with Alicyclic Epoxy Compound))

The curable compound may include one or more other polymerizable compounds (curable compounds) in addition to one or more alicyclic epoxy compounds. As the other polymerizable compounds, a (meth)acrylate compound such as a monofunctional (meth)acrylate compound or a polyfunctional (meth)acrylate compound, an oxirane compound, or an oxetane compound is preferable. In the present invention and this specification, a (meth)acrylate compound or (meth)acrylate represents a compound having one or more (meth)acryloyl groups in one molecule, and a (meth)acryloyl group represents either or both of an acryloyl group and a methacryloyl group.

The oxirane compound is also called ethylene oxide, and representative examples thereof include a functional group called a glycidyl group. In addition, the oxetane compound is a 4-membered cyclic ether. By using this polymerizable compound, for example, the (meth)acrylate compound in combination with the alicyclic epoxy compound, the (meth)acrylate compound and a polymer of the alicyclic epoxy compound forms an interpenetrating polymer network (IPN), and a polymer can be designed so as to exhibit desired mechanical properties and optical properties. In addition, the oxirane compound or the oxetane compound is copolymerizable with the alicyclic epoxy compound, and a polymer can be designed so as to exhibit desired mechanical properties and optical properties. In addition, by using these compounds in combination, the viscosity of the composition before curing, the dispersibility of the quantum dots, and the solubility of a photopolymerization initiator described below and other additives can also be adjusted.

In addition, the content of the curable compound including an alicyclic epoxy compound is preferably 10 to 99.9 mass %, more preferably 50 to 99.9 mass %, and still more preferably 92 to 99 mass % with respect to 100 mass % of the total amount of the quantum dot-containing curable composition.

(Adherence Agent)

The quantum dot-containing curable composition includes, as the adherence agent 40, a compound which is bondable to silicon nitride and/or silicon oxynitride as a major component of the barrier layers 12 and 22 and/or a compound which is bondable to silicon nitride and/or silicon oxynitride as a major component of the barrier layers 12 and 22 and is bondable to the organic matrix 30P.

The adherence agent 40 included in the curable composition is not particularly limited as long as it is a compound which is bondable to silicon nitride and/or silicon oxynitride as a major component of the barrier layers 12 and 22 to form the chemical structure A when the curable composition is cured to form the wavelength conversion layer 30.

It is preferable that the adherence agent 40 is a compound which is bondable to silicon nitride and/or silicon oxynitride as a major component of the barrier layers 12 and 22 and is bondable to the organic matrix 30P.

As described above, the chemical structure A is not particularly limited as long as it is a structure which is bonded to silicon nitride and/or silicon oxynitride as a major component of the barrier layer. Preferable examples of the chemical structure A include a structure which forms a covalent bond or a hydrogen bond with silicon nitride and/or silicon oxynitride.

As the chemical structure A which forms a covalent bond with silicon nitride and/or silicon oxynitride as a major component of the barrier layer, a structure which forms a siloxane bond with silicon nitride and/or silicon oxynitride as a major component of the barrier layer is preferable. Preferable examples of the compound which can form a siloxane bond with silicon nitride and/or silicon oxynitride include an alkoxysilane compound which is generally called a silane coupling agent.

In a case where the curable composition which forms the wavelength conversion layer 30 when cured includes an alkoxysilane compound as the adherence agent 40, the alkoxysilane compound forms a siloxane bond with silicon nitride and/or silicon oxynitride as a major component of a surface of the barrier layers 12 and 22 or a major component of the barrier layers 12 and 22 through a hydrolysis reaction or a condensation reaction. Therefore, a covalent bond is formed between the wavelength conversion layer 30 and the barrier layers 12 and 22, and adhesiveness therebetween can be improved.

Further, in a case where a reactive functional group such as a radically polymerizable group is included as the alkoxysilane compound, this radically polymerizable group and the organic matrix 30P which forms the wavelength conversion layer 30 can form a covalent bond so as to form a structure which is bonded to the organic matrix 30P as a part of a main chain of the polymer of the polymer matrix, or a structure (chemical structure B) which is bonded to the organic matrix 30P as a side chain or a side group of the polymer of the polymer matrix. With the above-described configuration, adhesiveness between the organic matrix 30P and the barrier layers 12 and 22 can be further improved. In addition, in a case where the alkoxysilane compound which can form a hydrogen bond with the organic matrix 30P so as to form the chemical structure B is used, the effect of improving adhesiveness can be obtained. It is more preferable that the chemical structure B is bonded to a chemical structure of the organic matrix 30P derived from the alicyclic epoxy compound.

As the chemical structure B which can form a covalent bond, a hydrogen bond, or the like with the organic matrix 30P, a structure which forms a covalent bond with the organic matrix 30P based on at least one of an amino group, a mercapto group, or an epoxy group, or a structure which can form a hydrogen bond with the organic matrix 30P based on at least one of an amino group, a carboxyl group, or a hydroxy group is preferable. The chemical structure B may be formed in advance in the curable compound itself. In this case, the adherence agent 40 is bonded to the curable compound through the chemical structure B.

As the alkoxysilane compound, a well-know n silane coupling agent can be used without any particular limitation. Examples of the silane coupling agent which is preferable from the viewpoint of adhesiveness include a silane coupling agent having the above-described functional group, and a silane coupling agent represented by Formula (1) described in JP2013-43382A. The details can be found in paragraphs "0011" to "0016" of JP2013-43382A.

Preferable examples of the silane coupling agent having a functional group which can form a covalent bond with the alicyclic epoxy compound include mercaptotrimethoxysilane, aminotrimethoxysilane, and glycidylmethoxysilane (refer to Examples described below). In addition, as the chemical structure A which forms a hydrogen bond with silicon nitride and/or silicon oxynitride as a major component of the barrier layer, a structure which forms a hydrogen bond with silicon nitride and/or silicon oxynitride as a major component of the barrier layer based on at least one of an amino group, a mercapto group, or a urethane structure is preferable.

It is preferable that the adherence agent 40 which can form a hydrogen bond with silicon nitride and/or silicon oxynitride to form the chemical structure A is a compound which can form a covalent bond, a hydrogen bond, or the like with the organic matrix 30P forming the wavelength conversion layer 30 to form the chemical structure B as in the case of an alkoxy silane compound.

Examples of the adherence agent 40 which forms a hydrogen bond with silicon nitride and/or silicon oxynitride to form the chemical structure A and forms a covalent bond or a hydrogen bond with the organic matrix 30P to form the chemical structure B include: urethane acrylates such as a phenyl glycidyl ether acrylate hexamethylene diisocyanate urethane prepolymer; phosphoric acid acrylates such as 2-(methacryloyloxy)ethyl phosphate; amino acrylates such as dimethylamino acrylate; and dithiols such as butane dithiol.

The addition amount of the adherence agent can be appropriately set. In a case where the addition amount is excessively large, oxygen permeability is likely to increase in the matrix, and a problem such as yellowing may occur depending on the kind of the adherence agent such as an adherence agent including a thiol group. It is preferable that the addition amount of the adherence agent is as low as possible within a range the effect of improving adhesiveness can be sufficiently obtained. Specifically, the addition amount of the adhesive is preferably 0.1 mass % to 10 mass %, more preferably 0.5 mass % to 8 mass %, and still more preferably 1 mass % to 5 mass % with respect to the total mass of the wavelength conversion layer.

(Polymerization Initiator)

It is preferable that the quantum dot-containing curable composition includes a polymerization initiator. As the polymerization initiator, a polymerization initiator which is preferable depending on the kind of the curable compound in the quantum dot-containing curable composition is preferably used, and a photopolymerization initiator is more preferably used. The photopolymerization initiator is a compound which is decomposed by light exposure to form an initiating species such as a radical or an acid. This compound can initiate and promote a polymerization reaction of the polymerizable compound using the initiating species.

The alicyclic epoxy compound is a cationically polymerizable compound. Therefore, it is preferable that the curable composition includes one or two or more photocationic polymerization initiators as the photopolymerization initiator. The details of the photocationic polymerization initiator can be found in, for example, paragraphs "0019" to "0024" of JP4675719. The content of the photocationic polymerization initiator is preferably 0.1 mol % or higher and more preferably 0.5 mol % to 5 mol % with respect to the total amount of the polymerizable compound included in the curable composition. It is preferable that an appropriate amount of the polymerization initiator is used from the viewpoints of reducing the light irradiation dose required for curing and uniformly curing the entire portion of the wavelength conversion layer.

Preferable examples of the photocationic polymerization initiator include an iodonium salt compound, a sulfonium salt compound, a pyridinium salt compound, and a phosphonium salt compound. Among these, an iodonium salt compound or a sulfonium salt compound is preferable from the viewpoint of obtaining excellent thermal stability, and an iodonium salt compound is more preferable from the viewpoint of suppressing absorption of light emitted from a light source of the wavelength conversion layer.

The iodonium salt compound is a salt which is formed using a cation site having I$^+$ in a structure thereof and an anion site having an arbitrary structure. It is preferable that the iodonium salt compound is a diaryl iodonium salt having three or more electron-donating groups at least one of which is an alkoxy group. By introducing an alkoxy group which is an electron-donating group into a diaryl iodonium salt, for example, decomposition caused by water or a nucleophilic agent over time, or electron transfer caused by heat can be suppressed. As a result, improvement in stability can be expected. Specific examples of the iodonium salt compound having the above-described structure include the following photocationic polymerization initiators (iodonium salt compounds) A and B.

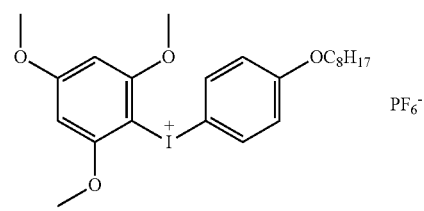

Photocationic Polymerization Initiator A

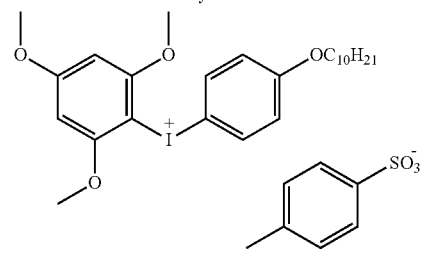

Photocationic Polymerization Initiator B

As described above, irrespective of whether or not the iodonium salt compound is used, the absorption of light emitted from a light source of the wavelength conversion layer 30 can be reduced, for example, by reducing the content of the alicyclic epoxy compound and using the (meth)acrylate compound in combination with the alicyclic epoxy compound. Therefore, the photocationic polymerization initiator which can be added to the curable composition is not limited to the iodonium salt compound. Examples of the photocationic polymerization initiator which can be used include one kind or a combination of two or more kinds selected from the following commercially available products including: CPI-11P (the following photocationic polymerization initiator C), CPI-101A, CPI-110P, and CPI-200K (all of which are manufactured by San-Apro Ltd.); WPI-113, WPI-116, WPI-124, WPI-169, and WPI-170 (all of which are manufactured by Wako Pure Chemical Industries, Ltd.); PI-2074 (manufactured by Rhodia); and IRGACURE (registered trade name) 250, IRGACURE 270, and IRGACURE 290 (the following photocationic polymerization initiator D) (all of which are manufactured by BASF SE).

(Viscosity Adjuster)

Optionally, the curable composition may include a viscosity adjuster. It is preferable that the viscosity adjuster is a filler having a particle size of 5 nm to 300 nm. In addition, it is preferable that the viscosity adjuster is a thixotropic agent. In the present invention and this specification, thixotropy refers to a property in which the viscosity of a liquid composition decreases along with an increase in shear rate, and the thixotropic agent refers to a material which has a function of imparting thixotropy to a liquid composition when added to the liquid composition. Specific examples of the thixotropic agent include fumed silica, alumina, silicon nitride, titanium dioxide, calcium carbonate, zinc oxide, talc, mica, feldspar, kaolinite (kaolin clay), pyrophyllite (pyrophyllite clay), sericite, bentonite, smectite and vermiculite (for example, montmorillonite, beidellite, nontronite, or saponite), organic bentonite, and organic smectite.

In an aspect, the viscosity of the curable composition is preferably 3 to 100 mPa·s at a shear rate of 500 s$^{-1}$ and is preferably 300 mPa·s at a shear rate of 1 s$^{-1}$. It is preferable that a thixotropic agent is used to adjust the viscosity as described above. The reason why the viscosity of the curable

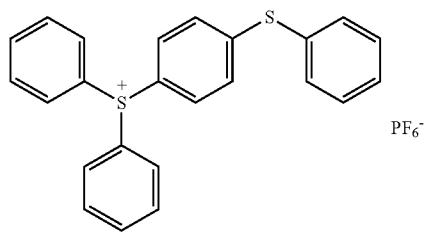

Photocationic Polymerization Initiator C

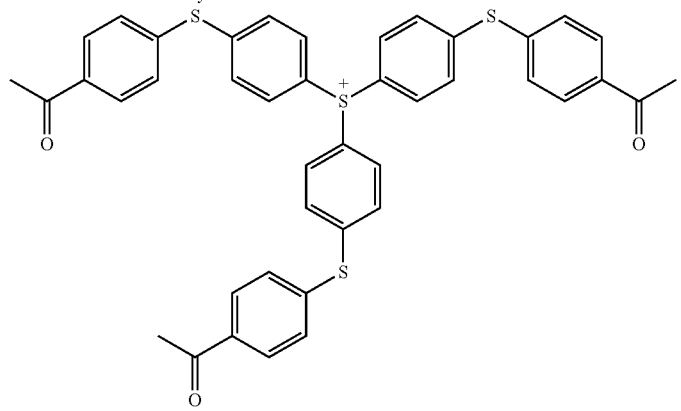

Photocationic Polymerization Initiator D

In addition, in a case where the curable composition includes a radically polymerizable compound, the curable composition may include one radical polymerization initiator or two or more radical polymerization initiators. As the radical polymerization initiator, a photoradical polymerization initiator is preferable. The details of the photoradical polymerization initiator can be found in paragraph "0037" of JP2013-043382A and paragraphs "0040" to "0042" of JP2011-159924A. The content of the photoradical polymerization initiator is preferably 0.1 mol % or higher and more preferably 0.5 mol % to 5 mol % with respect to the total mass of the polymerizable compound included in the quantum dot-containing polymerizable composition.

composition is preferably 3 to 100 mPa·s at a shear rate of 500 s$^{-1}$ and is preferably 300 mPa·s at a shear rate of 1 s$^{-1}$ is as follows.

Examples of a method of manufacturing the wavelength conversion member include a manufacturing method described below including a step of forming the wavelength conversion layer by applying the curable composition to the barrier film 10, laminating and adhering the barrier film 20 to a coating film of the curable composition, and curing the curable composition. In this manufacturing method, it is preferable that the curable composition is uniformly applied to the barrier film 10 so as not to form coating streaks such that the thickness of the coating film is uniform. To that end, from the viewpoints of coating properties and leveling properties, it is preferable that the viscosity of the coating solution (curable composition) is low. On the other hand, in order to uniformly adhere the barrier film 20 to the coating film formed on the barrier film 10, it is preferable that a resistance force against a pressure during adhering is high. From this viewpoint, it is preferable that the viscosity of the coating solution is high.

The shear rate of 500 s$^{-1}$ is a representative value of a shear rate applied to the coating solution which is applied to the barrier film 10. The shear rate of 1 s$^{-1}$ is a representative value of a shear rate applied to the coating solution immediately before adhering the barrier film 20 to the coating film. The shear rate of 1 s$^{-1}$ is merely a representative value. In a case where the barrier film 10 and the barrier film 20 are transported at the same rate when the barrier film 20 is adhered to the coating film formed on the barrier film 10, the shear rate applied to the coating solution is substantially 0 s$^{-1}$. In the actual manufacturing step, the shear rate applied to the coating solution is not limited to 1 s$^{-1}$. The shear rate of 500 s$^{-1}$ is merely a representative value. In the actual manufacturing step, the shear rate applied to the coating solution is not limited to 500 s$^{-1}$. From the viewpoint of uniform coating and adhering, it is preferable that the viscosity of the curable composition is 3 to 100 mPa·s at 500 s$^{-1}$ which is the representative value of the shear rate applied to the coating solution when the coating solution is applied to the barrier film 10 and that the viscosity of the curable composition is 300 mPa·s or higher at 1 s$^{-1}$ which is the representative value of the shear rate applied to the coating solution immediately before adhering the barrier film 20 to the coating solution applied to the barrier film 10.

(Solvent)

Optionally, the curable composition may include a solvent. In this case, the kind and addition amount of the solvent used are not particularly limited. For example, as the solvent, one organic solvent or a mixture of two or more organic solvents may be used.

(Other Additives)

Optionally, the curable composition may include other functional additives. Examples of the other functional additives include a leveling agent, an antifoaming agent, an antioxidant, a radical scavenger, a water gettering agent, an oxygen gettering agent, an UV absorber, a visible light absorber, an IR absorber, a dispersing auxiliary agent for assisting dispersion of a phosphor, a plasticizer, a brittleness improver, an antistatic agent, an antifouling agent, a filler, a oxygen permeability reducing agent for reducing the oxygen permeability of the wavelength conversion layer, a refractive index regulator, and a light scattering agent.

[Barrier Film]

The barrier films 10 and 20 are films having a function of suppressing permeation of water and/or oxygen. In the embodiment, the barrier layers 12 and 22 are provided on the substrates 11 and 21, respectively. In this configuration, due to the presence of the substrates, the strength of the wavelength conversion member 1D is improved, and the films can be easily manufactured.

In the wavelength conversion members according to the embodiment, the barrier films 10 and 20 in which the barrier layers 12 and 22 are supported by the substrates 11 and 21 are provided such that the barrier layers 12 and 22 are adjacent to opposite main surfaces of the wavelength conversion layer 30. However, the barrier layers 12 and 22 are not necessarily supported by the substrates 11 and 21. In addition, in a case where the substrates 11 and 21 have sufficient barrier properties, the barrier layers may include only the substrates 11 and 21.

In addition, it is preferable that the barrier films 10 and 20 are provided on opposite surfaces of the wavelength conversion layer 30 as in the embodiment. However, the barrier films 10 and 20 may be provided on only a single surface of the wavelength conversion layer 30.

The total light transmittance of the barrier film in the visible range is 80% or higher and more preferably 90% or higher. The visible range refers to a wavelength range of 380 nm to 780 nm, and the total light transmittance refers to an average light transmittance value in the visible range.

The oxygen permeability of the barrier films 10 and 20 is preferably 1.00 cm$^3$/(m$^2$·day·atm) or lower. The oxygen permeability of the barrier films 10 and 20 is more preferably 0.10 cm$^3$/(m$^2$·day·atm) or lower, and still more preferably 0.01 cm$^3$/(m$^2$·day·atm) or lower.

The barrier films 10 and 20 have not only a gas barrier function of blocking oxygen but also a function of blocking water (water vapor). In the wavelength conversion member 1D, the moisture permeability (water vapor transmission rate) of the barrier film 10 and 20 is 0.10 g/(m$^2$·day·atm) or lower. The moisture permeability of the barrier film 10 and 20 is preferably 0.01 g/(m$^2$·day·atm) or lower.

<Substrate>

In the wavelength conversion member 1D, at least one main surface of the wavelength conversion layer 30 is supported by the substrate 11 or 21. Here, "main surface" refers to a surface (a front surface or a rear surface) of the wavelength conversion layer which is disposed on a visible side or a backlight side when the wavelength conversion member is used. The same can also be applied to main surfaces of other layers and members.

As in the embodiment, it is preferable that front and rear main surfaces of the wavelength conversion layer 30 are supported by the substrates 11 and 21.

From the viewpoints of impact resistance and the like of the wavelength conversion member, the average thickness of the substrates 11 and 21 is preferably 10 μm to 500 μm, more preferably 20 μm to 400 μm, and still more preferably 30 μm to 300 μm. In a configuration where the retroreflection of light is increased as in a case where the concentration of the quantum dots 30A and 30B in the wavelength conversion layer 30 is reduced or a case where the thickness of the wavelength conversion layer 30 is reduced, it is preferable that the absorbance of light at a wavelength of 450 nm is low. Therefore, from the viewpoint of suppressing a decrease in brightness, the average thickness of the substrates 11 and 21 is preferably 40 μm or less and more preferably 25 μm or less.

In order to further reduce the concentration of the quantum dots 30A and 30B in the wavelength conversion layer 30 or to further reduce the thickness of the wavelength conversion layer 30, it is necessary that the number of times where the excitation light passes through the wavelength conversion layer is increased by providing means for increasing retroreflection of light, for example, a plurality of prism sheets in the retroreflecting member 2B of the backlight unit to maintain a display color of an LCD. Accordingly, it is preferable that the substrate is a transparent substrate which is transparent to visible light. Here, "transparent to visible light" represents that the light transmittance in the visible range is 80% or higher and preferably 85% or higher. The light transmittance used as an index for transparency can be measured using a method described in JIS-K 7105. That is, using an integrating sphere light transmittance measuring device, the total light transmittance and the scattered light amount are measured, and the diffuse transmittance is subtracted from the total light transmittance to obtain the light transmittance. The details of the substrate can be found in paragraphs "0046" to "0052" of JP2007-290369A and paragraphs "0040" to "0055" of JP2005-096108A.

In addition, the in-plane retardation Re(589) of the substrates 11 and 21 at a wavelength of 589 nm is preferably 1000 nm or lower, more preferably 500 nm or lower, and still more preferably 200 nm or lower.

When whether or not foreign matter or defects are present is inspected after the preparation of the wavelength conversion member 1D, foreign matter or defects can be easily found by disposing two polarizing plates at extinction positions and inserting the wavelength conversion member between the two polarizing plates to observe the wavelength conversion member. In a case where Re(589) of the substrate is in the above-described range, foreign matter or defects can be easily found during the inspection using the polarizing plates, which is preferable.

Here, Re(589) is measured using KOBRA 21ADH or WR (manufactured by Oji Scientific Instruments Co., Ltd.) by causing light at a wavelength of 589 nm to be incident in a film normal direction. The measurement wavelength λ nm can be selected by manually changing a wavelength selective filter or changing a measured value using a program or the like.

As the substrates 11 and 21, a substrate having barrier properties against oxygen and water is preferable. Preferable examples of the substrate include a polyethylene terephthalate film, a film which includes a polymer having a cyclic olefin structure, and a polystyrene film.

<Barrier Layer>

The substrates 11 and 21 include the barrier layers 12 and 22 that are formed adjacent to surfaces on the wavelength conversion layer 30 side, respectively. As described above, the barrier layers 12 and 22 are inorganic layers including silicon nitride and/or silicon oxynitride as a major component. It is preferable that the barrier layers 12 and 22 include silicon nitride as a major component.

A method of forming the barrier layer 12 or 22 is not particularly limited. For example, various film forming methods in which a film forming material can be evaporated or scattered to be deposited on a deposition target surface can be used.

Examples of the method of forming the barrier layer include a physical vapor deposition (PVD) method such as a vacuum deposition method, an oxidation deposition method, a sputtering method, or an ion plating method and a chemical vapor deposition (CVD) method.

The thickness of the barrier layer 12 or 22 may be 1 nm to 500 nm and is preferably 5 nm to 300 nm and more preferably 10 nm to 150 nm. By adjusting the thickness of the barrier layer adjacent to the wavelength conversion layer 30 to be in the above-described range, light absorption in the barrier layer can be suppressed while realizing excellent barrier properties, and the wavelength conversion member having a high light transmittance can be provided.

FIG. 2 shows the aspect where the barrier layers 12 and 22 are directly provided on the respective substrates. However, another inorganic layer or organic layer or a plurality of other inorganic layers or organic layers may be provided between the barrier layers 12 and 22 and the respective substrates within a range where the light transmittance of the wavelength conversion member does not excessively decrease.

The inorganic layer which may be provided between the barrier layers 12 and 22 and the respective substrates is not particularly limited, and various inorganic compounds such as a metal, an inorganic oxide, an inorganic nitride, or an inorganic oxynitride can be used. As an element constituting the inorganic material, silicon, aluminum, magnesium, titanium, tin, indium, or cerium is preferable. The inorganic material may include one element or two or more elements among the above elements. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, as the inorganic barrier layer, a metal film such as an aluminum film, a silver film, a tin film, a chromium film, a nickel film, or a titanium film may be provided. In a case where the inorganic layer is formed of silicon nitride or silicon oxynitride, the composition thereof is different from those of the barrier layers 12 and 22.

The details of the barrier layer can be found in JP2007-290369A, JP2005-096108A, and US2012/0113672A1.

[Unevenness Imparting Layer (Mat Layer)]

It is preferable that the barrier film 10 or 20 includes an unevenness imparting layer (mat layer) 13 which imparts an uneven structure to a surface of the barrier film 10 or 20 opposite to the wavelength conversion layer 30 side. In a case where the barrier film includes the mat layer, blocking properties and slipping properties of the barrier film can be improved, which is preferable. It is preferable that the mat layer is a layer including particles. Examples of the particles include inorganic particles such as silica, alumina, a metal oxide and organic particles such as crosslinked polymer particles. In addition, it is preferable that the mat layer is provided on a surface of the barrier film opposite to the wavelength conversion layer. However, the mat layer may be provided on opposite surfaces of the barrier film.

[Light Scattering Layer]

The wavelength conversion member 1D may have a light scattering function for efficiently extracting the fluorescence of the quantum dots to the outside. The light scattering function may be provided in the wavelength conversion layer 30, or a layer having a light scattering function may be separately provided as a light scattering layer.

In addition, the light scattering layer may be provided on a surface of the substrate opposite to the wavelength conversion layer. In a case where the mat layer is provided, it is preferable that the mat layer functions not only as an unevenness imparting layer but also as a light scattering layer.

[Method of Manufacturing Wavelength Conversion Member]

A method of manufacturing the wavelength conversion member according to the present invention sequentially includes:

a step of preparing the barrier films 10 and 20 that includes the barrier layers 12 and 22 on the substrates (supports) 11 and 21;

a step of forming a coating film 30M of a quantum dot-containing curable composition by applying the quantum dot-containing curable composition to surfaces of the barrier layers 12 and 22, the quantum dot-containing curable composition including the quantum dots 30A and 30B, an alicyclic epoxy compound, and a compound which is bondable to silicon nitride and/or silicon oxynitride as a major component of the barrier layers 12 and 22 and/or a compound which is bondable to silicon nitride and/or silicon oxynitride as a major component of the barrier layers 12 and 22 and is bondable to the organic matrix; and a step of photocuring or thermally curing the coating film 30M.

Using this method of manufacturing the wavelength conversion member according to the present invention, the wavelength conversion member according to the present invention can be manufactured.

Hereinafter, the method of manufacturing the wavelength conversion member according to the present invention will be described with reference to FIGS. 4 and 5 using an example where the wavelength conversion member 1D is manufactured by photocuring in which the barrier films 10 and 20 including the barrier layers 12 and 22 on the substrates 11 and 21 are provided on opposite surfaces of the wavelength conversion layer 30. However, the present invention is not limited to the following configuration.

In the embodiment, the wavelength conversion layer 30 can be formed by applying the prepared quantum dot-containing curable composition to surfaces of the barrier films 10 and 20 and irradiating the quantum dot-containing polymerizable composition with light or heating the quantum dot-containing polymerizable composition to be cured. Examples of a coating method include various coating methods such as a curtain coating method, a dip coating method, a spin coating method, a printing coating method, a spray coating method, a slot coating method, a roll coating method, a slide coating method, a blade coating method, a gravure coating method, or a wire bar method.

Curing conditions can be appropriately set depending on the kind of the curable compound used and the composition of the polymerizable composition. In addition, in a case where the quantum dot-containing curable composition includes a solvent, a drying treatment is performed to remove the solvent before curing.

Figure 4:
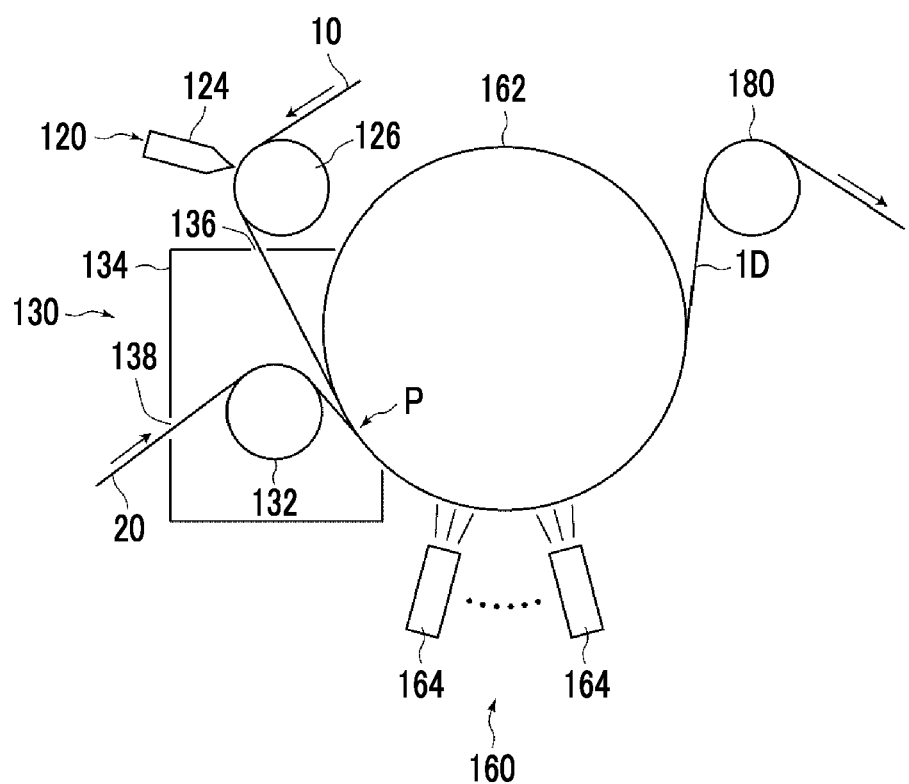
FIG. 4 is a diagram showing a schematic configuration of an example of a device for manufacturing a wavelength conversion member according to an embodiment of the present invention.
Figure 5:
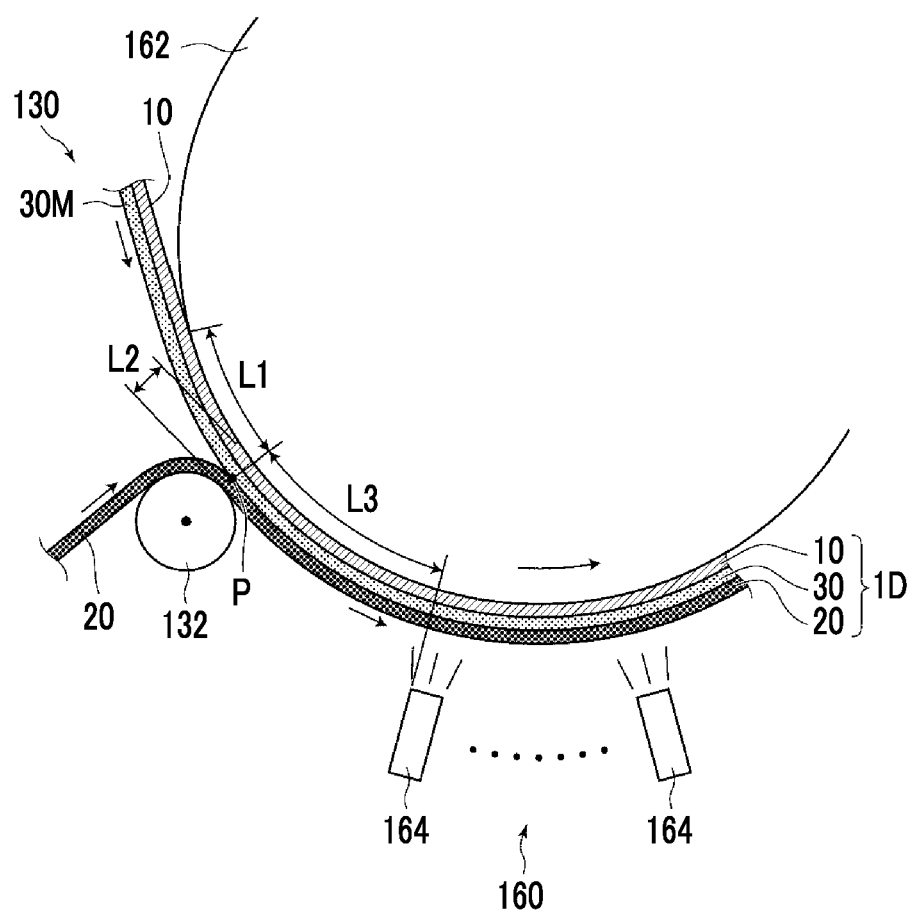
FIG. 5 is an enlarged view showing a part of the manufacturing device shown in FIG. 4.

FIG. 4 is a diagram showing a schematic configuration of an example of a device for manufacturing the wavelength conversion member 1D. FIG. 5 is an enlarged view showing a part of the manufacturing device shown in FIG. 4. The manufacturing device shown in FIG. 4 includes: a coating portion 120 that applies the coating solution including the quantum dot-containing curable composition to the barrier film 10; a laminating portion 130 that laminates the barrier film 20 on the coating film 30M formed in the coating portion 120; and a curing portion 160 that cures the coating film 30M. In the coating portion 120, the coating film 30M is formed with an extrusion coating method using a die coater 124.

Steps of manufacturing the wavelength conversion member using the manufacturing device shown in FIGS. 4 and 5 include at least: a step of forming a coating film 30M by applying the quantum dot-containing curable composition to a surface of the first barrier film 10 (hereinafter, referred to as "first film") which is continuously transported; a step of interposing the coating film 30M between the first film 10 and the second barrier film 20 (hereinafter, referred to as "second film") by laminating the second film 20, which is continuously transported, on the coating film 30M; and a step of forming the wavelength conversion layer (cured layer) by winding any one of the first film 10 and the second film 20 around a backup roller 126 in a state where the coating film 30M is interposed between the first film 10 and the second film 20, and irradiating the coating film 30M with light to be cured and polymerized while being continuously transported. In the embodiment, as the first film 10 and the second film 20, the barrier films having barrier properties against oxygen and water are used. With the above-described configuration, the wavelength conversion member 1D in which opposite surfaces of the wavelength conversion layer are protected by the barrier films can be obtained.

More specifically, first, the first film 10 is continuously transported from a transporter (not shown) to a coating portion 120. The first film 10 is transported from the transporter at a transport speed of, for example, 1 to 50 m/min. In this case, the transport speed is not limited to the above value. During the transportation, for example, a tension of 20 to 150 N/m and preferably 30 to 100 N/m is applied to the first film 10.

In the coating portion 120, the quantum dot-containing curable composition (hereinafter, also referred to as "coating solution") is applied to a surface of the first film 10, which is continuously transported, to form a coating film 30M (refer to FIG. 4) thereon. In the coating portion 120, for example, a die coater 124 and a backup roller 126 which is disposed to face the die coater 124 are provided. A surface of the first film 10 opposite to the surface on which the coating film 30M is formed is wound around the backup roller 126, and the coating solution is applied from a jetting port of the die coater 124 to the surface of the first film 10 which is continuously transported, to form the coating film 30M thereon. Here, the coating film 30M refers to the quantum dot-containing curable composition which is applied to the first film 10 and is not cured.

In the embodiment, the die coater 124 to which an extrusion coating method is applied is used as a coating device, but the present invention is not limited thereto. For example, coating devices to which various methods such as a curtain coating method, an extrusion coating method, a rod coating method, or a roll coating method are applied can be used.

The first film 10 which has passed through the coating portion 120 and on which the coating film 30M is formed is continuously transported to a laminating portion 130. In the laminating portion 130, the second film 20 which is continuously transported is laminated on the coating film 30M such that the coating film 30M is interposed between the first film 10 and the second film 20.

In the laminating portion 130, a laminating roller 132 and a heating chamber 134 which surrounds the laminating roller 132 are provided. In the heating chamber 134, an opening 136 through which the first film 10 passes and an opening 138 through which the second film 20 passes are provided.

At a position opposite to the laminating roller 132, a backup roller 162 is disposed. The first film 10 on which the coating film 30M is formed is continuously transported to a laminating position P in a state where a surface opposite to the surface on which the coating film 30M is formed is wound around the backup roller 162. The laminating position P refers to a position where contact between the second film 20 and the coating film 30M starts. It is preferable that the first film 10 is wound around the backup roller 162 before reaching the laminating position P. The reason for this is that, even in a case where wrinkles are formed in the first film 10, the wrinkles are corrected and removed by the backup roller 162 before reaching the laminating position P. Therefore, it is preferably that a distance L1 from a position (contact position) where the first film 10 is wound around the backup roller 162 to the laminating position P is long. For example, the distance L is preferably 30 mm or longer, and the upper limit value thereof is typically determined based on a diameter and a pass line of the backup roller 162.

In the embodiment, the second film 20 is laminated by the backup roller 162 which is used in a curing portion 160 and the laminating roller 132. That is, the backup roller 162 which is used in the curing portion 160 also functions as a roller used in the laminating portion 130. However, the present invention is not limited to this configuration. A laminating roller other than the backup roller 162 may be provided in the laminating portion 130 such that the backup roller 162 does not function as a roller used in the laminating portion 130.

By using the backup roller 162, which is used in the curing portion 160, in the laminating portion 130, the number of rollers can be reduced. In addition, the backup roller 162 can also be used as a heat roller for heating the first film 10.

The second film 20 transported from a transporter (not shown) is wound around the laminating roller 132 and is continuously transported between the laminating roller 132 and the backup roller 162. At the laminating position P, the second film 20 is laminated on the coating film 30M formed on the first film 10. As a result, the coating film 30M is interposed between the first film 10 and the second film 20. Laminating described herein represents that the second film 20 is laminated on the coating film 30M.

It is preferable that a distance L2 between the laminating roller 132 and the backup roller 162 is more than the total thickness of the first film 10, the wavelength conversion layer (cured layer) 30 obtained by curing and polymerizing the coating film 30M, and the second film 20. In addition, it is preferable that L2 is equal to or less than a length obtained by adding 5 mm to the total thickness of the first film 10, the coating film 30M, and the second film 20. By adjusting the distance L2 to be equal to or less than the length obtained by adding 5 mm to the total thickness, permeation of bubbles into a gap between the second film 20 and the coating film 30M can be prevented. Here, the distance L2 between the laminating roller 132 and the backup roller 162 refers to the shortest distance between the outer circumferential surface of the laminating roller 132 and the outer circumferential surface of the backup roller 162.

Regarding the rotational accuracy of the laminating roller 132 and the backup roller 162, the radial run-out is 0.05 mm or less and preferably 0.01 mm or less. As the radial run-out decreases, the thickness distribution of the coating film 30M can be reduced.

In addition, in order to suppress thermal deformation after the coating film 30M is interposed between the first film 10 and the second film 20, a difference between the temperature of the backup roller 162 and the temperature of the first film 10 in the curing portion 160 and a difference between the temperature of the backup roller 162 and the temperature of the second film 20 are preferably 30° C. or lower, more preferably 15° C. or lower, and still more preferably 0° C.

In a case where the heating chamber 134 is provided in order to reduce the differences from the temperature of the backup roller 162, it is preferable that the first film 10 and the second film 20 are heated in the heating chamber 134. For example, hot air is supplied from a hot air blower (not shown) into the heating chamber 134 such that the first film 10 and the second film 20 can be heated.

The first film 10 may be wound around the backup roller 162 whose temperature is controlled such that the first film 10 is heated by the backup roller 162.

On the other hand, regarding the second film 20, by using a heat roller as the laminating roller 132, the second film 20 can be heated by the laminating roller 132. In this case, the heating chamber 134 and the heat roller are not essential but can be optionally provided.

Next, the coating film 30M is continuously transported to the curing portion 160 while being interposed between the first film 10 and the second film 20. In the configuration shown in the drawing, curing in the curing portion 160 is performed by light irradiation. However, in a case where the curable compound included in the quantum dot-containing curable composition is polymerizable by heating, curing can be performed by heating such as blowing of warm air. During this curing, the adherence agent can be bonded to silicon nitride and/or silicon oxynitride as a major component of the barrier layers 12 and 22 to form the chemical structure A in the wavelength conversion layer 30. Further, in a case where the adherence agent 40 forms the chemical structure B and is bonded to the organic matrix 30P in the curing step, the chemical structure B is also formed in the curing step.

At a position opposite to the backup roller 162, a light irradiating device 164 is provided. The first film 10 and the second film 20 between which the coating film 30M is interposed are continuously transported between the backup roller 162 and the light irradiating device 164. Light irradiated by the light irradiating device may be determined depending on the kind of the photocurable compound in the quantum dot-containing curable composition. For example, ultraviolet light is used. Here, the ultraviolet light refers to light in a wavelength range of 280 to 400 nm. As a light source which emits ultraviolet light, for example, a low-pressure mercury lamp, a middle-pressure mercury lamp, a high-pressure mercury lamp, an ultrahigh-pressure mercury lamp, a carbon arc lamp, a metal halide lamp, or a xenon lamp can be used. The irradiation dose may be determined in a range where the polymerization and curing reaction can be performed. For example, the coating film 30M is irradiated with ultraviolet light in an irradiation dose of 100 to 10000 mJ/cm$^2$.

In the curing portion 160, the first film 10 is wound around the backup roller 162 in a state where the coating film 30M is interposed between the first film 10 and the second film 20, and the coating film 30M is irradiated with light by the light irradiating device 164 while being continuously transported. As a result, the coating film 30M is cured to form the wavelength conversion layer (cured layer) 30.

In the embodiment, the first film 10 side is wound around the backup roller 162 and is continuously transported. However, the second film 20 may be wound around the backup roller 162 and may be continuously transported.

"Being wound around the backup roller 162" represents a state where any one of the first film 10 and the second film 20 is in contact with a surface of the backup roller 162 at a given lap angle. Accordingly, the first film 10 and the second film 20 move in synchronization with the rotation of the backup roller 162 while being continuously transported. Any one of the first film 10 and the second film 20 only has to be wound around the backup roller 162 while at least being irradiated with ultraviolet light.

The backup roller 162 includes a main body having a cylindrical shape and a rotating shaft that is disposed at opposite end portions of the main body. The main body of the backup roller 162 has a diameter ϕ of, for example, 200 to 1000 mm. The diameter ϕ of the backup roller 162 is not particularly limited. The diameter ϕ is preferably 300 to 500 mm from the viewpoints of curling deformation of the laminated film, facility costs, and rotational accuracy. By mounting a temperature controller on the main body of the backup roller 162, the temperature of the backup roller 162 can be controlled.

The temperature of the backup roller 162 can be determined in consideration of heat generation during the light irradiation, the curing efficiency of the coating film 30M, and the wrinkling of the first film 10 and the second film 20 on the backup roller 162. The temperature of the backup roller 162 is set to be in a temperature range of preferably 10° C. to 95° C., and more preferably 15° C. to 85° C. Here, the temperature regarding a roller refers to the surface temperature of the roller.

A distance L3 between the laminating position P and the light irradiating device 164 can be made to be, for example, 30 mm or more.

The coating film 30M is irradiated with light to form the cured layer 30, and the wavelength conversion member 1D including the first film 10, the cured layer 30, and the second film 20 is manufactured. The wavelength conversion member 1D is peeled off from the backup roller 162 by a peeling roller 180. The wavelength conversion member 1D is continuously transported to a winder (not shown) and then is wound in a roll shape by the winder.

Hereinabove, regarding the method of manufacturing the wavelength conversion member according to the present invention, the aspect where the barrier layers are provided on opposite surfaces of the wavelength conversion layer has been described. However, the method of manufacturing the wavelength conversion member according to the present invention is also applicable to an aspect where the barrier layer is provided on only a single surface of the wavelength conversion layer 30. The wavelength conversion member according to this aspect can be manufactured by using a substrate not including the barrier layer as the second film.

In the manufacturing method of the wavelength conversion member, the second film 20 is laminated before curing the coating film 30M after forming the coating film 30M on the first film 10, and then the coating film 30M is cured in a state where the coating film 30M is interposed between the first film 10 and the second film 20. On the other hand, in the aspect where the barrier layer is provided on only a single surface of the wavelength conversion layer 30, the coating film 30M is formed on the first film 10 and is optionally dried and cured to form the wavelength conversion layer (cured layer). Optionally, a coating layer is formed on the wavelength conversion layer, and then the second film which is formed of a substrate not including the barrier layer is laminated on the wavelength conversion layer with an adhesive (and the coating layer) interposed therebetween. As a result, the wavelength conversion member 1D can be formed. The coating layer includes one or more other layers such as an inorganic layer and can be formed using a well-known method.

[Backlight Unit]

As described above, the backlight unit 2 shown in FIG. 1 includes: a surface light source 1C including a light source 1A, which emits primary light (blue light $L_B$), and a light guide plate 1B which guides and emits the primary light emitted from the light source 1A; a wavelength conversion member 1D that is provided on the surface light source 1C; a retroreflecting member 2B that is disposed to face the surface light source 1C with the wavelength conversion member 1D interposed therebetween; and a reflection plate 2A that is disposed to face the wavelength conversion member 1D with the surface light source 1C interposed therebetween. The wavelength conversion member 1D are excited by excitation light, which is at least a portion of the primary light $L_B$ emitted from the surface light source 1C, to emit fluorescence and emits secondary light ($L_G$, $L_R$) which includes the fluorescence and the primary light $L_B$ which does not function as excitation light.

From the viewpoint of realizing high brightness and high color reproducibility, it is preferable that the backlight unit includes a multi-wavelength light source. For example, it is preferable that blue light having a center emission wavelength in a wavelength range of 430 nm to 480 nm and having a full width at half maximum of emission peak of 100 nm or less, green light having a center emission wavelength in a wavelength range of 500 nm or longer and shorter than 600 nm and having a full width at half maximum of emission peak of 100 nm or less, and red light having a center emission wavelength in a wavelength range of 600 nm to 680 nm and having a full width at half maximum of emission intensity peak of 100 nm or less are emitted.

From the viewpoint of further improving brightness and color reproducibility, the wavelength range of the blue light emitted from the backlight unit 2 is preferably 430 nm to 480 nm and more preferably 440 nm to 460 nm.

From the same viewpoint, the wavelength range of the green light emitted from the backlight unit 2 is preferably 520 nm to 560 nm and more preferably 520 nm to 545 nm.

From the same viewpoint, the wavelength range of the red light emitted from the backlight unit is preferably 600 nm to 680 nm and more preferably 610 nm to 640 nm.

In addition, from the same viewpoint, the full width at half maximum of the emission intensity of each of the blue light, the green light, and the red light emitted from the backlight unit is preferably 80 nm or less, more preferably 50 nm or less, still more preferably 40 nm or less, and still more preferably 30 nm or less. In particular, it is more preferable that the full width at half maximum of the emission intensity of the blue light is 25 nm or less.

The backlight unit 2 includes at least the wavelength conversion member 1D and the surface light source 1C. As the light source 1A, for example, a light source which emits blue light having a center emission wavelength in a wavelength range of 430 nm to 480 nm, or a light source which emits ultraviolet light can be used. As the light source 1A, for example, a light emitting diode or a laser light source can be used.

As shown in FIG. 1, the surface light source 1C may include: the light source 1A; and the light guide plate 1B that guides and emits the primary light emitted from the light source 1A. Alternatively, the surface light source 1C may include: the light source 1A that is disposed along with a plane parallel to the wavelength conversion member 1D; and a diffusion plate 1E that is provided instead of the light guide plate 1B. The former surface light source is called an edge light mode, and the latter surface light source is called a direct backlight mode.

In the embodiment, the example in which the surface light source is used as the light source has been described. As the light source, a light surface other than the surface light source can also be used.

(Configuration of Backlight Unit)

In the above description regarding FIG. 1, the configuration of the backlight unit is an edge light mode including a light guide plate or a reflection plate as a component. However, the configuration of the backlight unit may be a direct backlight mode. As the light guide plate, a well-known light guide plate can be used without any particular limitation.

In addition, as the reflection plate 2A, a well-known reflection plate can be used without any particular limitation. The details of the reflection plate 2A can be found in JP3416302B, JP3363565B, JP4091978B, and JP3448626B, the contents of which are incorporated herein by reference.

The retroreflecting member 2B may be formed of a well-known diffusion plate, a diffusion sheet, a prism sheet (for example, BEF series, manufactured by Sumitomo 3M Ltd.), or a light guide. The configuration of the retroreflecting member 2B can be found in JP3416302B, JP3363565B, JP4091978B, and JP3448626B, the contents of which are incorporated herein by reference.

[Liquid Crystal Display Device]

Figure 6:
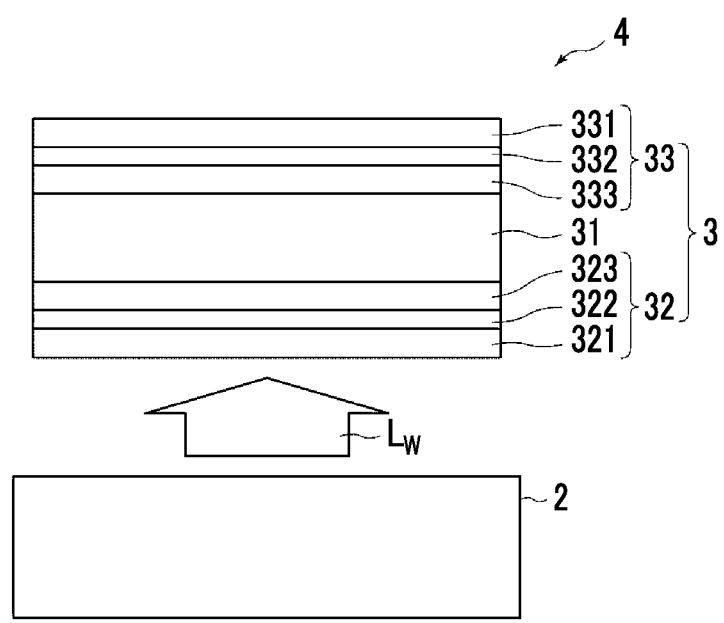
FIG. 6 is a cross-sectional view showing a schematic configuration of a liquid crystal display device including a backlight unit according to an embodiment of the present invention.

The above-described backlight unit 2 can be applied to a liquid crystal display device. As shown in FIG. 6, a liquid crystal display device 4 includes: the backlight unit 2 according to the embodiment; and a liquid crystal cell unit 3 that is disposed to face the retroreflecting member side of the backlight unit 2.

In the liquid crystal cell unit 3, as shown in FIG. 6, a liquid crystal cell 31 is interposed between polarizing plates 32 and 33. In the polarizing plates 32 and 33, opposite main surfaces of polarizers 322 and 332 are protected by polarizing plate protective films 321 and 323 and polarizing plate protective films 331 and 333, respectively.

Regarding each of the liquid crystal cell 31, the polarizing plates 32 and 33, and other components which constitute the liquid crystal display device 4, a product prepared using a well-known method or a commercially available product can be used without any particular limitation. In addition, undoubtedly, a well-known interlayer such as an adhesive layer can be provided between respective layers.

As a driving mode of the liquid crystal cell 31, various modes such as a twisted nematic (TN) mode, a super twisted nematic (STN) mode, a vertical alignment (VA) mode, an in-plane switching (IPS) mode, or an optically compensated bend (OCB) mode can be used without any particular limitation. The liquid crystal cell is preferably a VA mode, an OCB mode, an IPS mode, or a TN mode but is not limited thereto. Examples of the configuration of the VA mode liquid crystal display device include a configuration shown in FIG. 2 described in JP2008-262161A. However, a specific configuration of the liquid crystal display device is not particularly limited, and a well-known configuration can be adopted.

Optionally, the liquid crystal display device 4 further includes an optical compensation member for optical compensation or a sub-functional layer such as an adhesive layer. Further, in addition to (or instead of) a color filter substrate, a thin film transistor substrate, a lens film, a diffusion sheet, a hard coat layer, an anti-reflection layer, a low-reflection layer, or an anti-glare layer, a surface layer such as a forward scattering layer, a primer layer, an antistatic layer, or an undercoat layer may be disposed.

The backlight-side polarizing plate 32 may include a phase difference film as the polarizing plate protective film 323 on the liquid crystal cell 31 side. As this phase difference film, for example, a well-known cellulose acylate film can be used.

The backlight unit 2 and the liquid crystal display device 4 includes the wavelength conversion member according to the present invention having excellent light fastness. Therefore, the backlight unit 2 and the liquid crystal display device 4 exhibit the same effects as those of the wavelength conversion member according to the present invention, in which peeling at an interface of the wavelength conversion layer including quantum dots is not likely to occur, the light fastness is excellent, the brightness durability is high, and the long-term reliability of brightness is high.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

1. Preparation of Barrier Film (Preparation of First Barrier Film (High Barrier Film))

A barrier layer was formed on a single surface of a polyethylene terephthalate film (PET film, manufactured by Toyobo Co., Ltd. trade name: COSMOSHINE A4300, thickness: 50 μm) substrate in the following procedure.

First, trimethylolpropane triacrylate (TMPTA, manufactured by Daicel-Cytec Co., Ltd.) and a photopolymerization initiator (ESACURE KTO 46, manufactured by Lamberti S.p.A.) were prepared and were weighed such that a mass ratio thereof was 95:5. These components were dissolved in methyl ethyl ketone. As a result, a coating solution having a solid content concentration of 15% was obtained. This coating solution was applied to the above-described PET film using a roll-to-roll method with a die coater and was allowed to pass through a drying zone at 50° C. for 3 minutes. Next, in a nitrogen atmosphere, the coating solution was irradiated with ultraviolet light (cumulative irradiation dose: about 600 mJ/cm$^2$) to be cured, and the PET film was wound. The thickness of the organic barrier layer formed on the PET film substrate was 1 μm.

Next, the PET film with the organic barrier layer was set on a transport portion of a roll-to-roll type vacuum deposition device for vacuum evacuation, and then an inorganic barrier layer (silicon nitride layer) was formed on a surface of the PET substrate using a chemical vapor deposition (CVD) method and a CVD device.

As raw material gases, silane gas (flow rate: 160 sccm), ammonia gas (flow rate: 370 sccm), hydrogen gas (flow rate: 590 sccm), and nitrogen gas (flow rate: 240 sccm) were used. As a power supply, a high-frequency power supply having a frequency of 13.56 MHz was used. The film forming pressure was 40 Pa, and the achieved thickness was 50 nm. This way, a first barrier film in which the organic barrier layer and the inorganic barrier layer were formed in this order on the substrate was prepared. In the barrier film, the moisture permeability measured under conditions of 40° C., and 90% RH was 0.001 g/(m$^2$·day·atm), and the oxygen permeability measured under conditions of measurement temperature: 23° C. and 90% RH was 0.02 cm$^3$/(m$^2$·day·atm).

(Second Film (Low Barrier Film))

A polyethylene terephthalate film (PET film; trade name: COSMOSHINE (registered trade name) A4300, manufactured by Toyobo Co., Ltd., thickness: 50 μm) was prepared as a second film. The treatments of forming the barrier layer and the like were not performed. In this film, the oxygen permeability measured under conditions of measurement temperature: 23° C., and 90% RH was 20 cm$^3$/(m$^2$·day·atm).

2. Preparation of Wavelength Conversion Member

Example 1

—Preparation of Quantum Dot-Containing Curable Composition—

The quantum dot-containing polymerizable composition was prepared at the following composition ratio, was filtered through a filter formed of polypropylene having a pore size of 0.2 μm, and was dried under a reduced pressure for 30 minutes to prepare a coating solution according to Example 1. In the following description, CZ520-100 (manufactured by NN-Labs LLC.) was used as a quantum dot dispersion 1 having a maximum emission wavelength of 535 nm, and CZ620-100 (manufactured by NN-Labs LLC.) was used as a quantum dot dispersion 2 having a maximum emission wavelength of 630 nm. Here, in these quantum dots, a core was CdSe, a shell was ZnS, and a ligand was octadecylamine. The quantum dots were dispersed in toluene in a concentration of 3 wt %. CELLOXIDE 2021P (manufactured by Daicel Corporation) was used as an alicyclic epoxy compound I.

| Quantum Dot-Containing Polymerizable Composition | |
|---|---|
| Quantum Dot Dispersion 1 (Maximum Emission Wavelength: 535 nm) | 10 Parts by Mass |
| Quantum Dot Dispersion 2 (Maximum Emission Wavelength: 630 nm) | 1 Part by Mass |
| Alicyclic Epoxy Compound I (Matrix Material) | 90 Parts by Mass |
| 3-Glycidyloxytrimethoxysilane (Adherence Agent) | 5 Parts by Mass |
| Photopolymerization Initiator IRGACURE 819 (Manufactured by BASF SE) | 1 Part by Mass |

—Preparation of Wavelength Conversion Member—

Next, the first barrier film was prepared, and the prepared quantum dot-containing polymerizable composition was applied to the surface of the inorganic layer using a die coater while continuously transporting the first barrier film at 1 m/min with a tension of 60 N/m. As a result, a coating film having a thickness of 50 μm was formed. Next, the first barrier film in which the coating film was formed was wound around the backup roller, and another first barrier film was laminated on the coating film such that the barrier layer surface faced the coating film. Next, the laminate was allowed to pass through a heating zone at 100° C. for 3 minutes while being continuously transported in a state where the coating film was interposed between the first barrier films. Next, the wavelength conversion layer including the quantum dots was cured by irradiating it with ultraviolet light using an air-cooled metal halide lamp (manufactured by Eye Graphics Co., Ltd.) of 160 W/cm. As a result, a wavelength conversion member was prepared. The irradiation dose of ultraviolet light was 2000 mJ/cm$^2$.

Example 2

A wavelength conversion member was prepared using the same method as in Example 1, except that the adherence agent was changed from 3-glycidyloxytrimethoxysilane to 3-mercaptopropyltrimethoxysilane.

Example 3

A wavelength conversion member was prepared using the same method as in Example 1, except that the adherence agent was changed from 3-glycidyloxytrimethoxysilane to 3-aminopropyltrimethoxysilane.

Example 4

A wavelength conversion member was prepared using the same method as in Example 1, except that the matrix material was changed from the alicyclic epoxy compound I to an alicyclic epoxy compound II. CELLOXIDE 8000 (manufactured by Daicel Corporation) was used as an alicyclic epoxy compound II.

Example 5

A wavelength conversion member was prepared using the same method as in Example 1, except that trimethoxysilylpropyl methacrylate which did not form a bond with the matrix material and had low compatibility was used as the adherence agent.

Comparative Example 1

A wavelength conversion member was prepared using the same method as in Example 1, except that: the adherence agent was not added to the quantum dot-containing curable composition; and not the alicyclic epoxy compound but an aliphatic epoxy compound was used as the matrix material. As the aliphatic epoxy compound, 828US (manufactured by Mitsubishi Chemical Corporation) was used.

Comparative Example 2

A wavelength conversion member was prepared using the same method as in Example 1, except that not the alicyclic epoxy compound but an aliphatic epoxy compound was used as the matrix material. As the aliphatic epoxy compound, the same compound as in Comparative Example 1 was used.

Comparative Example 3

A wavelength conversion member was prepared using the same method as in Example 1, except that the adherence agent was not added to the quantum dot-containing curable composition.

Comparative Example 4

A wavelength conversion member was prepared using the same method as in Example 1, except that the barrier film was changed from the first barrier film having high barrier properties to the second film having low barrier properties.

4. Evaluation of Wavelength Conversion Member

The wavelength conversion member according to each example was evaluated in the following evaluation item. Table 1 shows the evaluation results.

(Evaluation of Oxygen Barrier Properties of Matrix)

Only the matrix material of the wavelength conversion layer used in Examples and Comparative Examples was applied to a substrate to form a coating film having a thickness of 100 μm, and the coating film was peeled off from the substrate. As a result, a single film was obtained. The oxygen permeability of the obtained single film was measured using an oxygen permeability measuring device (OX-TRAN 2/20 (trade name), manufactured by Mocon Inc.) under conditions of measurement temperature: 23° C., and relative humidity: 90%. Based on this result, the oxygen barrier properties of the wavelength conversion member were evaluated based on the following evaluation standards.

A: 10.00 cm$^3$/(m$^2$·day·atm) or lower

B: higher than 10.00 cm$^3$/(m$^2$·day·atm) and 100.0 cm$^3$/(m$^2$·day·atm) or lower C: higher than 100.0 cm$^3$/(m$^2$·day·atm)

(Light Fastness Evaluation)

The wavelength conversion member according to each of the Examples and Comparative Examples was cut into a rectangular shape having a size of 3 cm×3 cm. In a room held at 25° C., and 60% RH, the wavelength conversion member according to each example was placed on a commercially available blue light source (OPSM-HI50X142B, manufactured by OPTEX FA Co., Ltd.), and was continuously irradiated with blue light for 100 hours.

After the continuous irradiation, an end portion of the wavelength conversion member was observed. The distance from the end portion interface of the wavelength conversion member to a boundary surface of a region in the center direction where light emission behavior was lost or light emission was attenuated was represented by d, and this value was evaluated.

Evaluation Standards d≤0.1 mm: A (Excellent)

0.1 mm<d≤0.5 mm: B (Good)

0.5 mm<d: C (Not Good)

(Evaluation of Brightness Durability (Brightness Deterioration))

A commercially available tablet terminal (Kindle Fire HDX 7", manufactured by Amazon.com Inc.) was disassembled to extract a backlight unit. The wavelength conversion member according to each example which was cut into a rectangular shape was placed on a light guide plate of the extracted backlight unit, and two prism sheets whose surface roughness pattern directions were perpendicular to each other were laminated thereon. The brightness of light, which was emitted from a blue light source and passed through the wavelength conversion member and the two prism sheets was measured using a brightness meter (SR3, manufactured by Topcon Corporation) provided at a distance of 740 mm perpendicular to the surface of the light guide plate. The measurement was performed at inner positions which were at a distant of 5 mm from four corners of the wavelength conversion member, and the average value (Y0) of the measured values at the four corners was set as an evaluation value.

Using the same method as that of the light fastness evaluation, the wavelength conversion member was irradiated with blue light for 100 hours in a room held at 25° C. and 60% RH. After the continuous irradiation, the brightness (Y1) at the four corners of the wavelength conversion member was measured using the same method as that of the evaluation of the brightness before the continuous irradiation. A change rate (ΔY) between the brightness before the continuous irradiation and the brightness after the continuous irradiation was obtained and was set as an index for a brightness change. The results are shown in Table 1.

$$\Delta Y = (Y0 - Y1) \div Y0 \times 100$$

Evaluation Standards

ΔY<20: A (Excellent)

20≤ΔY≤30: B (Good)

30<ΔY: C (Not Good)

(Evaluation of Adhesiveness)

The 180° peeling adhesive strength of the wavelength conversion member according to each example was measured using a method described in JIS Z 0237. The adhesiveness of each example was evaluated from the measurement results based on the following evaluation standards. The obtained results are shown in Table 1.

The 180° peeling adhesive strength was 2.015 N/10 mm or higher: A (Excellent)

The 180° peeling adhesive strength was 0.5 N/10 mm or higher and lower than 2.015 N/10 mm: B (Good)

The 180° peeling adhesive strength was lower than 0.5 N/10 mm: C (Not Good)

It was found from Table 1 that, in the wavelength conversion member according to each of the Examples, the adhesiveness of the wavelength conversion layer and the barrier layer adjacent thereto was high, and the light fastness was excellent. In addition, it was found that, in a liquid crystal display device into which the wavelength conversion member according to each of the Examples was incorporated, deterioration in the brightness of the end portion was small, and long-term reliability was high.

It was found that, in Comparative Examples 1 and 2, not the alicyclic epoxy compound but the aliphatic epoxy compound was used as the matrix material of the wavelength conversion layer, and thus sufficient oxygen barrier properties was not able to be obtained.

In addition, Comparative Example 3 has the same configuration as in Example 1, except that the wavelength conversion layer did not include the adherence agent component. Comparative Example 3 is different from Comparative Example 1, in that the alicyclic epoxy compound was used as the matrix material of the wavelength conversion layer. In Comparative Example 3, the oxygen barrier properties of the wavelength conversion layer were higher, and thus oxygen barrier properties and brightness durability are improved as compared to Comparative Example 1. However, the adherence agent was not included, and adhesiveness between the wavelength conversion layer and the barrier layer deteriorated. In Comparative Example 4, deterioration in brightness durability caused by the barrier properties of the barrier film was found.

TABLE 1

| | Curing Composition for Wavelength Conversion Layer | | | Evaluation Result | | | |
|---|---|---|---|---|---|---|---|
| | Matrix | Adherence Agent | Oxygen Barrier Properties | Barrier Layer | Light Fastness | Brightness Durability | Adhesiveness |
| Example 1 | Alicyclic Epoxy Compound I | 3-Glycidyloxytrimethoxysilane | A | SiN | A | A | A |
| Example 2 | Alicyclic Epoxy Compound I | 3-Mercaptopropyltrimethoxysilane | A | SiN | A | A | A |
| Example 3 | Alicyclic Epoxy Compound I | 3-Aminopropyltrimethoxysilane | A | SiN | A | A | A |
| Example 4 | Alicyclic Epoxy Compound II | 3-Glycidyloxytrimethoxysilane | B | SiN | B | B | A |
| Example 5 | Alicyclic Epoxy Compound I | Trimethoxysilylpropyl Methacrylate | B | SiN | B | B | B |
| Comparative Example 1 | Alicyclic Epoxy Compound | — | C | SiN | C | C | B |
| Comparative Example 2 | Alicyclic Epoxy Compound | 3-Glycidyloxytrimethoxysilane | C | SiN | C | C | B |
| Comparative Example 3 | Alicyclic Epoxy Compound I | — | B | SiN | B | B | C |
| Comparative Example 4 | Alicyclic Epoxy Compound I | 3-Glycidyloxytrimethoxysilane | A | None | C | C | A |

EXPLANATION OF REFERENCES

1C: surface light source
1D: wavelength conversion member
2: backlight unit
2A: reflection plate
2B: retroreflecting member
3: liquid crystal cell unit
4: liquid crystal display device
10, 20: barrier film
11, 21: substrate
12, 22: barrier layer
13: unevenness imparting layer (mat layer, light diffusion layer)
30: wavelength conversion layer
30A, 30B: quantum dots
30P: organic matrix
40: compound or adherence agent having chemical structure A
$L_B$: excitation light (primary light, blue light)
$L_R$: red light (secondary light, fluorescence)
$L_G$: green light (secondary light, fluorescence)

What is claimed is:

1. A wavelength conversion member comprising:
   a wavelength conversion layer including at least one kind of quantum dots that are excited by excitation light to emit fluorescence and are dispersed in an organic matrix; and
   a barrier layer that is provided adjacent to at least one main surface of the wavelength conversion layer and includes silicon nitride and/or silicon oxynitride as a major component,
   wherein the organic matrix is obtained by curing a curable composition including at least an alicyclic epoxy compound and includes a chemical structure A which is bonded to silicon nitride and/or silicon oxynitride as a major component of the barrier layer,
   wherein the chemical structure A is bonded to the organic matrix through a chemical structure B, and
   wherein the chemical structure B forms a covalent bond with the organic matrix.

2. The wavelength conversion member according to claim 1,
   wherein the chemical structure A forms a covalent bond with silicon nitride and/or silicon oxynitride as a major component of the barrier layer.

3. The wavelength conversion member according to claim 1,
   wherein the chemical structure A forms a hydrogen bond with silicon nitride and/or silicon oxynitride as a major component of the barrier layer.

4. The wavelength conversion member according to claim 2,
   wherein the chemical structure A forms a siloxane bond with silicon nitride and/or silicon oxynitride as a major component of the barrier layer.

5. The wavelength conversion member according to claim 3,
   wherein the chemical structure A forms a hydrogen bond based on at least one of an amino group, a mercapto group, or a urethane structure with silicon nitride and/or silicon oxynitride as a major component of the barrier layer.

6. The wavelength conversion member according to claim 1,
   wherein the chemical structure B forms a covalent bond based on at least one of an amino group, a mercapto group, or an epoxy group with the organic matrix.

7. The wavelength conversion member according to claim 1,
   wherein the barrier layer includes silicon nitride as a major component.

8. The wavelength conversion member according to claim 1,
   wherein the alicyclic epoxy compound is an alicyclic epoxy compound I represented by the following formula,

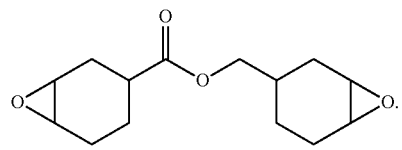

Alicyclic Epoxy Compound I

9. The wavelength conversion member according to claim 1,
   wherein the wavelength conversion layer is formed by curing a quantum dot-containing curable composition including the quantum dots, the alicyclic epoxy compound, and a compound which is bonded to silicon nitride and/or silicon oxynitride as a major component of the barrier layer to form the chemical structure A.

10. The wavelength conversion member according to claim 9,
    wherein the compound which forms the chemical structure A further forms the chemical structure B with the organic matrix.

11. A backlight unit comprising:
    a surface light source that emits primary light;
    the wavelength conversion member according to claim 1 that is provided on the surface light source;
    a retroreflecting member that is disposed to face the surface light source with the wavelength conversion member interposed therebetween; and
    a reflection plate that is disposed to face the wavelength conversion member with the surface light source interposed therebetween,
    wherein the wavelength conversion member is excited by excitation light, which is at least a portion of the primary light emitted from the surface light source, to emit the fluorescence and emits at least light which includes secondary light including the fluorescence.

12. A liquid crystal display device comprising:
    the backlight unit according to claim 11; and
    a liquid crystal cell unit that is disposed to face the retroreflecting member side of the backlight unit.

* * * * *